United States Patent
Hsu

(10) Patent No.: US 12,396,192 B2
(45) Date of Patent: Aug. 19, 2025

(54) LEAKAGE REDUCTION FOR MULTI-GATE DEVICES

(71) Applicant: Taiwan Semiconductor Manufacturing Company, Ltd., Hsinchu (TW)

(72) Inventor: Chao-Wei Hsu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 466 days.

(21) Appl. No.: 17/707,005

(22) Filed: Mar. 29, 2022

(65) Prior Publication Data

US 2023/0120656 A1 Apr. 20, 2023

Related U.S. Application Data

(60) Provisional application No. 63/257,717, filed on Oct. 20, 2021.

(51) Int. Cl.
*H10D 30/01* (2025.01)
*H10D 30/62* (2025.01)
(Continued)

(52) U.S. Cl.
CPC ..... *H10D 30/0243* (2025.01); *H10D 30/6211* (2025.01); *H10D 84/013* (2025.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS 6,274,894 B1 8/2001 Wieczorek
10,483,396 B1 11/2019 Chin
(Continued)

FOREIGN PATENT DOCUMENTS

DE 102017117795 A1 5/2018
KR 20160117117 A 10/2016
(Continued)

*Primary Examiner* — Christine S. Kim
*Assistant Examiner* — Cole Leon Lindsey
(74) *Attorney, Agent, or Firm* — HAYNES AND BOONE, LLP

(57) ABSTRACT

Methods and semiconductor structures are provided. A method according to the present disclosure includes depositing a top epitaxial layer over a substrate, forming a fin structure from the top epitaxial layer and a portion of the substrate, recessing a source/drain region of the fin structure to form a source/drain recess, conformally depositing a semiconductor layer over surfaces of the source/drain recess, etching back the semiconductor layer to form a diffusion stop layer over a bottom surface of the source/drain recess, depositing a first epitaxial layer over the diffusion stop layer and sidewalls source/drain recess, depositing a second epitaxial layer over the first epitaxial layer, and depositing a third epitaxial layer over the second epitaxial layer. A germanium concentration of the diffusion stop layer is greater than a germanium concentration of the top epitaxial layer or a germanium concentration of the first epitaxial layer.

20 Claims, 35 Drawing Sheets

(51) Int. Cl.
*H10D 30/69* (2025.01)
*H10D 84/01* (2025.01)
*H10D 84/03* (2025.01)

(52) U.S. Cl.
CPC ....... *H10D 84/0158* (2025.01); *H10D 84/038* (2025.01); *H10D 30/797* (2025.01)

(58) Field of Classification Search
CPC ........... H01L 27/1211; H01L 29/41791; H01L 29/66795–66818; H01L 29/785–7856; H01L 2029/7857–7858; H01L 2924/13067; H01L 29/04–045; H01L 29/16–1608; H01L 29/18–185; H01L 29/22–2206; H01L 29/36–365; H10B 12/36; H10B 12/056

See application file for complete search history.

(56) References Cited

U.S. PATENT DOCUMENTS

| | | |
|---|---|---|
| 11,245,036 B1 | 2/2022 | Chen et al. |
| 11,276,643 B2 | 3/2022 | Huang et al. |
| 2012/0276695 A1 | 11/2012 | Cheng |
| 2016/0163827 A1* | 6/2016 | Cheng ............... H01L 21/02639 438/299 |
| 2016/0211264 A1* | 7/2016 | Peng .................... H10D 84/038 |
| 2018/0151378 A1 | 5/2018 | Huang |
| 2019/0148527 A1* | 5/2019 | More ................ H01L 21/26513 257/401 |
| 2019/0214314 A1* | 7/2019 | Seo .................... H01L 29/78696 |
| 2019/0296129 A1 | 9/2019 | Cheng |
| 2019/0341472 A1* | 11/2019 | Lee ....................... H10D 64/021 |
| 2020/0105876 A1 | 4/2020 | Ting |
| 2020/0105932 A1 | 4/2020 | Li |
| 2020/0176581 A1* | 6/2020 | Lee ................. H01L 21/823821 |
| 2021/0118877 A1* | 4/2021 | Kim ................... H10D 84/0151 |

FOREIGN PATENT DOCUMENTS

| | | |
|---|---|---|
| KR | 20170077753 A | 7/2017 |
| KR | 20200036733 A | 4/2020 |
| KR | 20200086607 A | 7/2020 |
| TW | 202139356 A | 10/2021 |

\* cited by examiner

LEAKAGE REDUCTION FOR MULTI-GATE DEVICES

PRIORITY DATA

This application claims priority to U.S. Provisional Patent Application No. 63/257,717, filed Oct. 20, 2021, the entirety of which is hereby incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

To improve performance of a multi-gate transistor, efforts are invested to develop structures that reduce leakage, capacitance and resistance. While conventional multi-gate transistor structures are generally adequate to their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
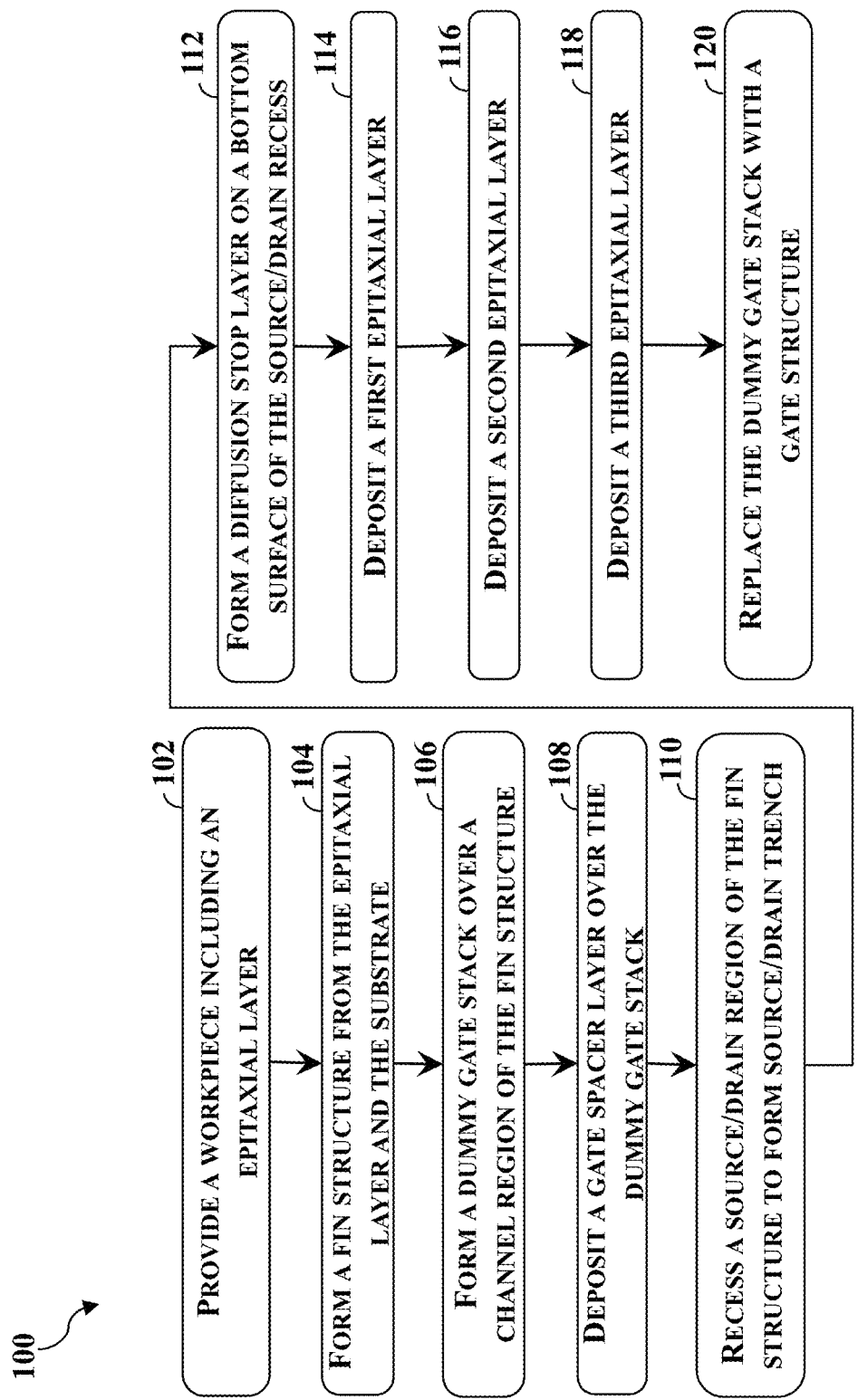
FIG. 1 illustrates a flowchart of a method 100 for forming a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to multi-gate transistors and fabrication methods, and more particularly to diffusion stop layers between source/drain features of multi-gate transistors and the underlying substrate. According to embodiments of the present disclosure, each of the source/drain features is disposed on a diffusion stop layer. In one embodiment, a source/drain feature includes an outer epitaxial layer in contact with the diffusion stop layer and an inner epitaxial layer spaced apart from the diffusion stop layer. A germanium content of the diffusion stop layer is greater than a germanium content of the outer epitaxial layer. In some instances, the diffusion stop layer may be lightly doped with a dopant that is different from that in the outer epitaxial layer. To form the diffusion stop layer, a semiconductor layer is deposited in a conformal manner to cover a bottom surface and sidewalls of a source/drain recess. An etch back process is performed to remove the semiconductor layer deposited on sidewalls of the source/drain recess. The etch back process is configured such that an etch rate along the [110] crystalline direction is greater than an etch rate along the [100] crystalline direction. The diffusion stop layer of the present disclosure may reduce bottom leakage and may change the source/drain feature profile to reduce parasitic capacitance.

Figure 20:
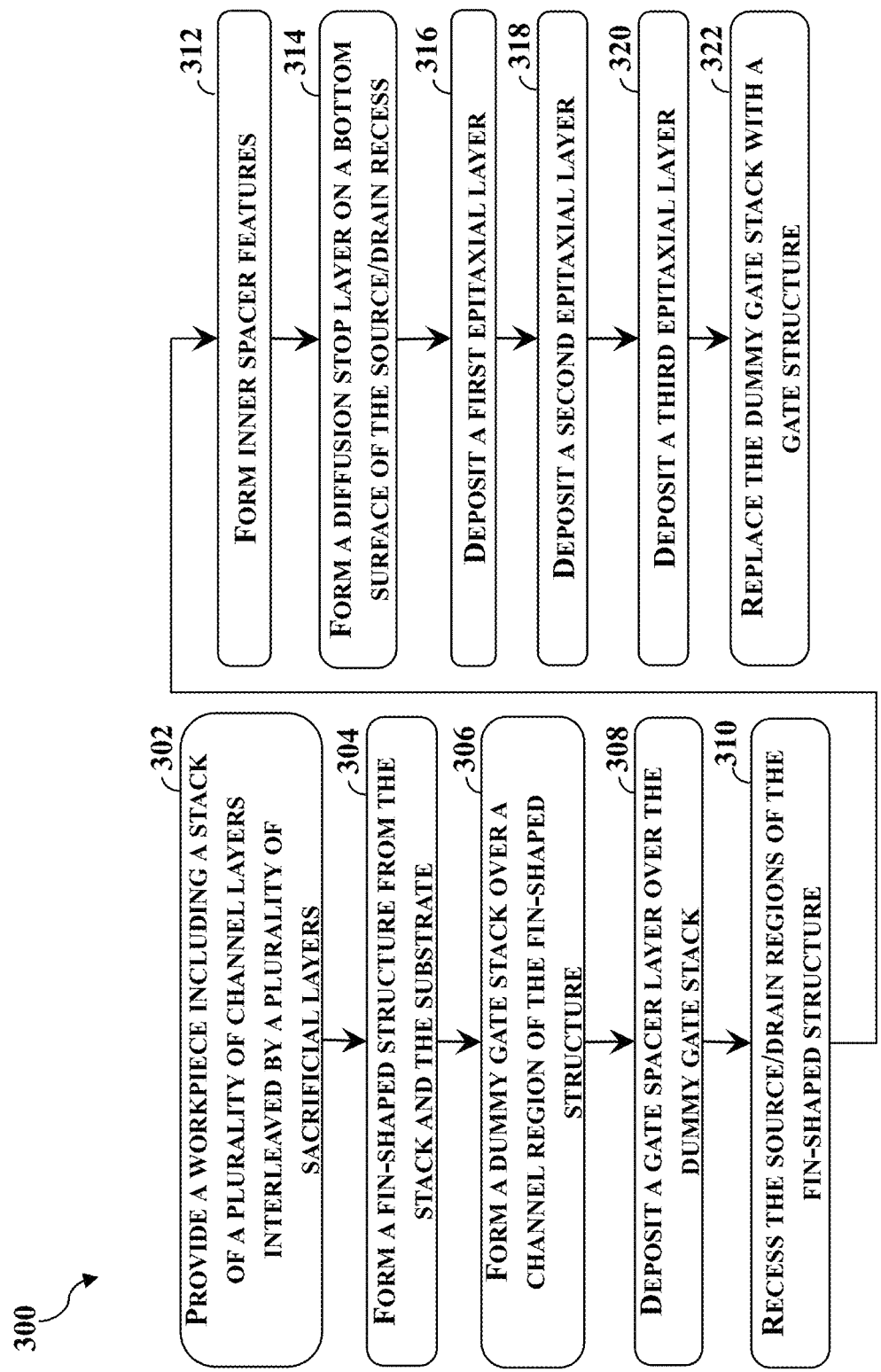
FIG. 20 illustrates a flowchart of a method 300 for forming a semiconductor device, according to one or more aspects of the present disclosure.

The various aspects of the present disclosure will now be described in more detail with reference to the figures. In that regard, FIGS. 1 and 20 are flowcharts illustrating a method 100 and a method 300, respectively, for forming a semiconductor structure from a workpiece according to embodiments of the present disclosure. Methods 100 and 300 are merely examples and are not intended to limit the present disclosure to what is explicitly illustrated herein. Additional steps can be provided before, during and after the method 100 or method 300, and some steps described can be replaced, eliminated, or moved around for additional embodiments of the method. Not all steps are described herein in detail for reasons of simplicity. Method 100 is described below in conjunction with FIG. 2-15, which are fragmentary cross-sectional views of a workpiece 200 at different stages of fabrication according to embodiments of the method 100 in FIG. 1. Method 300 is described below in conjunction with FIG. 21-33, which are fragmentary cross-sectional views of a workpiece 400 at different stages of fabrication according to embodiments of the method 300 in FIG. 20. Because the workpiece 200 or the workpiece 400 will be fabricated into a semiconductor structure or a semiconductor device, the workpiece 200 or the workpiece 400 may be referred to herein as a semiconductor structure or a semiconductor device as the context requires. For avoidance, the X, Y and Z directions in FIGS. 2-15 and FIGS. 21-33 are perpendicular to one another. Throughout the present disclosure, unless expressly otherwise described, like reference numerals denote like features.

Figure 2:
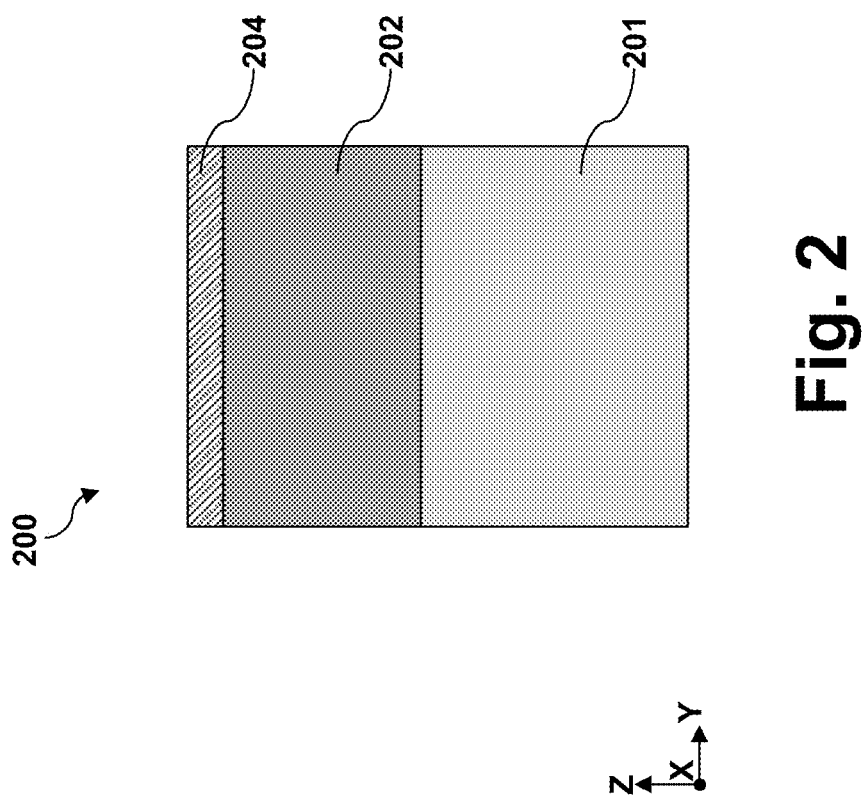
FIGS. 2-15 illustrate fragmentary cross-sectional views of a workpiece during a fabrication process according to the method 100 of FIG. 1, according to one or more aspects of the present disclosure.

Referring to FIGS. 1 and 2, method 100 includes a block 102 where a workpiece 200 is provided. As shown in FIG. 2, the workpiece 200 includes a substrate 201 and an epitaxial layer 202 disposed directly on the substrate 201. The substrate 201 may be a semiconductor substrate such as a silicon (Si), germanium (Ge), or a silicon germanium (SiGe) substrate. In one embodiment, the substrate 201 is a silicon (Si) substrate. The substrate 201 may include various doping configurations depending on design requirements known in the art. In embodiments where the semiconductor device formed on the workpiece 200 is p-type, an n-type doping profile (i.e., an n-type well or n-well) may be formed on the substrate 201. In some implementations, the n-type dopant for forming the n-type well may include phosphorus (P) or arsenic (As). In embodiments where the semiconductor device formed on the workpiece 200 is n-type, a p-type doping profile (i.e., a p-type well or p-well) may be formed on the substrate 201. In some implementations, the p-type dopant for forming the p-type well may include boron (B) or gallium (Ga). The suitable doping may include ion implantation of dopants and/or diffusion processes. In some embodiments not explicitly shown in the figures, the substrate 201 may include anti-punch through (APT) implantation regions in the wells. The APT implantation regions and the underlying well regions may share the same type of dopant but the dopant concentration in the APT implantation regions are higher. Generally speaking, well regions may be formed using high energy and low doses of dopants while APT implantation regions may be formed using low energy and high doses of dopants. As a result, wells extend further into the substrate 201 while the APT implantation regions are shallower and have a high dopant concentration. While APT implantation regions also function to slow down dopant out-diffusion and reduce leakage, they are formed early in the process and tend to diffuse outward during various thermal cycles as the fabrication process progresses. Contrarily, the diffusion stop layer of the present disclosure is formed right over the source/drain regions to provide precise diffusion control and leakage reduction at the place where it is needed most. Because the diffusion stop layer of the present disclosure is formed much later in the process, it is less likely to diffuse outward like the APT implantation regions do.

The workpiece 200 further includes the epitaxial layer 202. A composition of the epitaxial layer 202 may be different from a composition of the substrate 201. In one embodiment, the substrate 201 is formed of silicon (Si) and the epitaxial layer 202 is formed silicon germanium (SiGe). The epitaxial layer 202 is deposited on the substrate 201 using a molecular beam epitaxy (MBE) process, a vapor phase deposition (VPE) process, and/or other suitable epitaxial growth processes. Due to the compositional difference, lattices of the epitaxial layer 202 and the substrate 201 are mismatched and the epitaxial layer 202 is strained. When the substrate 201 is a silicon (Si) substrate, a germanium content of the epitaxial layer 202 may be between about 18% and about 25%. When the germanium content of the epitaxial layer 202 is lower than 18%, the epitaxial layer 202 may not provide a good environment for satisfactory formation of an overlying source/drain feature. When the germanium content of the epitaxial layer 202 is greater than 25%, the lattice mismatch between the substrate 201 and the epitaxial layer 202 may be too great such that the epitaxial layer 202 may have a high defect density, which may also impact the formation of the overlying source/drain feature.

Figure 3:
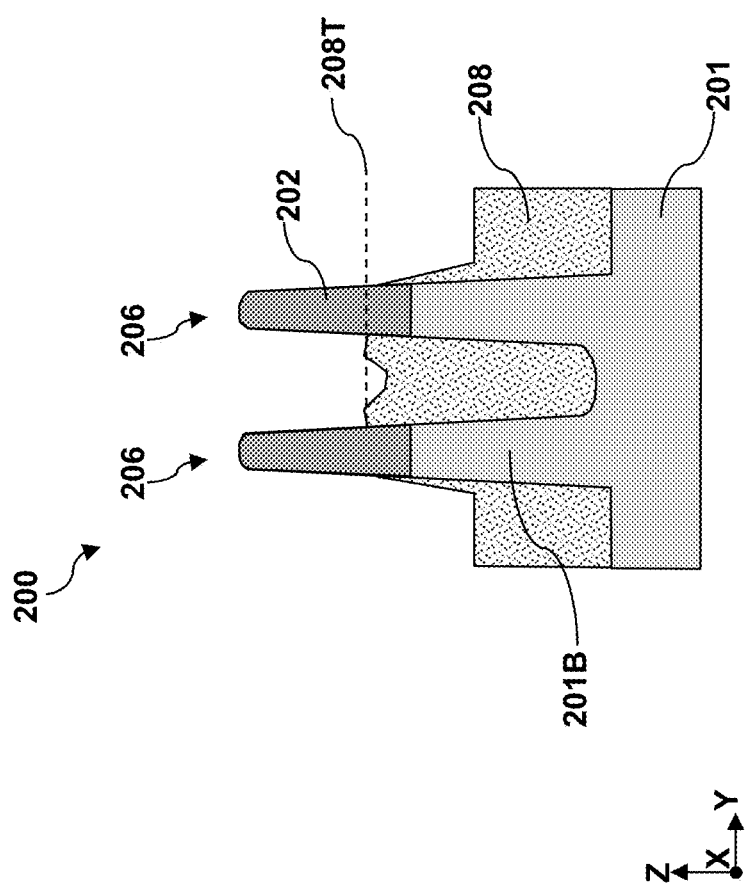

Referring still to FIGS. 1, 2 and 3, method 100 includes a block 104 where a fin structure 206 is formed from the epitaxial layer 202 and the substrate 201. To pattern the epitaxial layer 202 and a portion of the substrate 201, a hard mask layer 204 (shown in FIG. 2) may be deposited over the epitaxial layer 202 to form an etch mask. The hard mask layer 204 may be a single layer or a multi-layer. For example, the hard mask layer 204 may include a pad oxide layer and a pad nitride layer disposed over the pad oxide layer. The fin structure 206 may be patterned from the epitaxial layer 202 and the substrate 201 using a lithography process and an etch process. The lithography process may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etching (e.g., RIE etching), wet etching, and/or other etching methods. As shown in FIG. 3, the etch process at block 104 forms trenches extending vertically through the epitaxial layer 202 and a portion of the substrate 201. The trenches define the fin structures 206. In some implementations, double-patterning or multi-patterning processes may be used to define fin structures that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the fin structure 206 by etching the epitaxial layer 202 and the substrate 201. As shown in FIG. 3, the fin structure 206 includes a base fin structure 201B patterned from the substrate 201 and a top portion patterned from the epitaxial layer 202. In that sense, each of the fin structures 206 may be regarded as having a base portion and a top portion on the base portion.

An isolation feature 208 is formed adjacent the fin structure 206. In some embodiments represented in FIG. 3, the isolation feature 208 is disposed on sidewalls of the base fin structure 201B. In some embodiments, the isolation feature 208 may be formed in the trenches to isolate the fin structures 206 from a neighboring fin structure. The isolation feature 208 may also be referred to as a shallow trench isolation (STI) feature 208. By way of example, in some embodiments, a dielectric layer is first deposited over the substrate 201, filling the trenches with the dielectric layer. The dielectric layer may include silicon oxide, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, a spin-on coating process, and/or other suitable process. The deposited dielectric material is then thinned and planarized, for example by a chemical mechanical polishing (CMP) process. The planarized dielectric layer is further recessed or pulled-back by a dry etching process, a wet etching process, and/or a combination thereof to form the STI feature 208 shown in FIG. 3. The fin structure 206 rises above the STI feature 208 after the recessing, while the base fin structure 201B is embedded or buried in the isolation feature 208. In some embodiments illustrated in FIG. 3, due to loading effect, the isolation feature 208 between two adjacent fin structures 206 may have a top surface 208T that is higher than the isolation feature 208 not between two adjacent fin structures 208.

Figure 4:
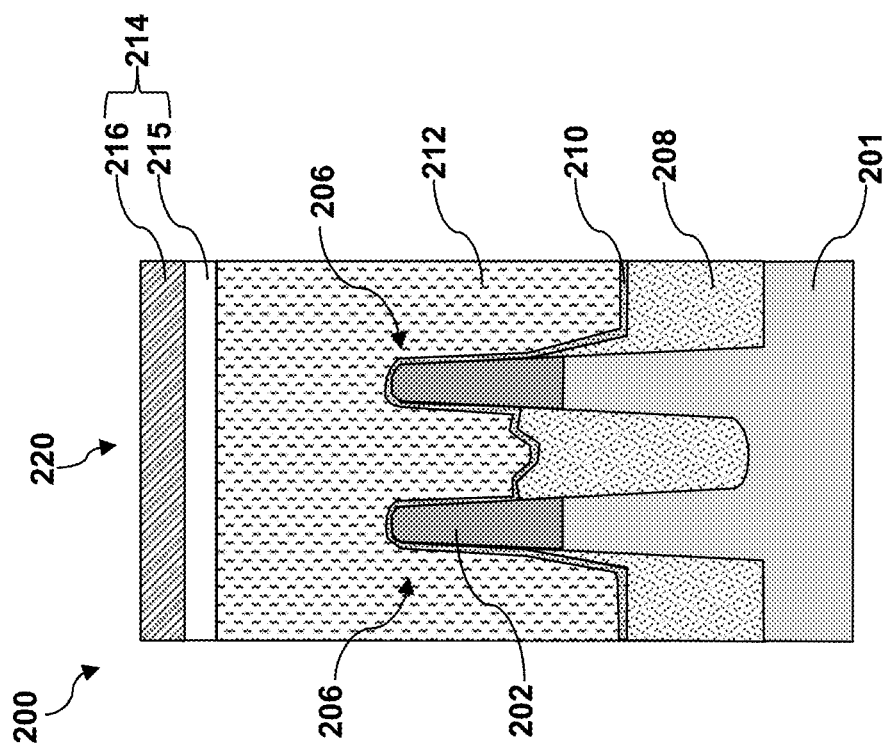
Figure 5:
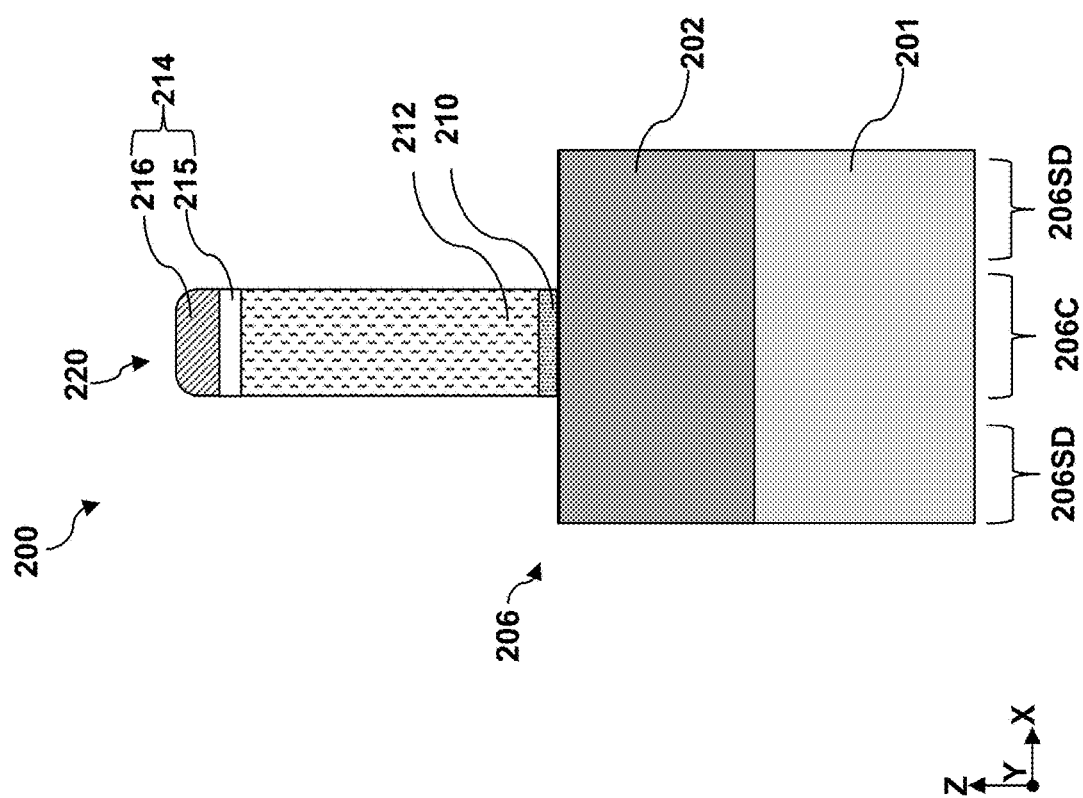

Referring to FIGS. 1, 4 and 5, method 100 includes a block 106 where a dummy gate stack 220 is formed over a channel region 206C of the fin structure 206. In some embodiments, a gate replacement process (or gate-last process) is adopted where the dummy gate stack 220 (shown in FIGS. 4 and 5) serves as a placeholder to undergo various processes and is to be removed and replaced by a functional gate structure. Other processes and configuration are possible. In some embodiments illustrated in FIG. 5, the dummy gate stack 220 is formed over the fin structure 206 and the fin structure 206 may be divided into channel regions 206C underlying the dummy gate stacks 220 and source/drain regions 206SD that do not underlie the dummy gate stacks 220. The channel regions 206C are adjacent the source/drain regions 206SD. As shown in FIG. 5, the channel region 206C is disposed between two source/drain regions 206SD along the X direction.

The formation of the dummy gate stack 220 may include deposition of layers in the dummy gate stack 220 and patterning of these layers. Referring to FIG. 4, a dummy dielectric layer 210, a dummy electrode layer 212, and a gate-top hard mask layer 214 may be blanketly deposited over the workpiece 200. In some embodiments, the dummy dielectric layer 210 may be formed on the fin structure 206 using a chemical vapor deposition (CVD) process, an ALD process, an oxygen plasma oxidation process, or other suitable processes. In some instances, the dummy dielectric layer 210 may include silicon oxide. Thereafter, the dummy electrode layer 212 may be deposited over the dummy dielectric layer 210 using a CVD process, an ALD process, or other suitable processes. In some instances, the dummy electrode layer 212 may include polysilicon. For patterning purposes, the gate-top hard mask layer 214 may be deposited on the dummy electrode layer 212 using a CVD process, an ALD process, or other suitable processes. The gate-top hard mask layer 214, the dummy electrode layer 212 and the dummy dielectric layer 210 may then be patterned to form the dummy gate stack 220, as shown in FIG. 5. For example, the patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the gate-top hard mask layer 214 may include a silicon oxide layer 215 and a silicon nitride layer 216 over the silicon oxide layer 215. As shown in FIG. 5, the dummy gate stack 220 is patterned such that it is only disposed over the channel region 206C, not disposed over the source/drain region 206SD.

Figure 6:
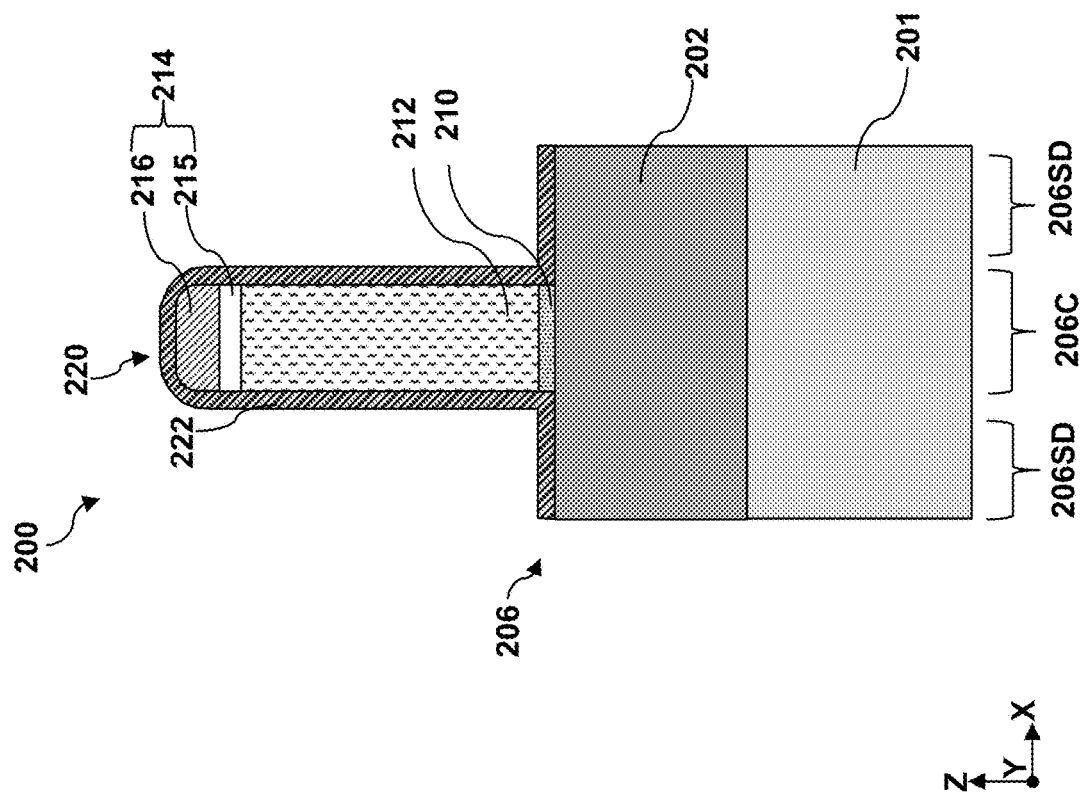

Referring to FIGS. 1 and 6, method 100 includes a block 108 where a gate spacer layer 222 is deposited over the workpiece 200, including over the dummy gate stack 220. In some embodiments, the gate spacer layer 222 is deposited conformally over the workpiece 200, including over top surfaces and sidewalls of the dummy gate stack 220. The term "conformally" may be used herein for ease of description of a layer having substantially uniform thickness over various regions. The gate spacer layer 222 may be a single layer or a multi-layer. The at least one layer in the gate spacer layer 222 may include silicon carbonitride, silicon oxycarbide, silicon oxycarbonitride, silicon oxynitride, or silicon nitride. The gate spacer layer 222 may be deposited over the dummy gate stack 220 using processes such as, a CVD process, a subatmospheric CVD (SACVD) process, an ALD process, or other suitable process.

Figure 7:
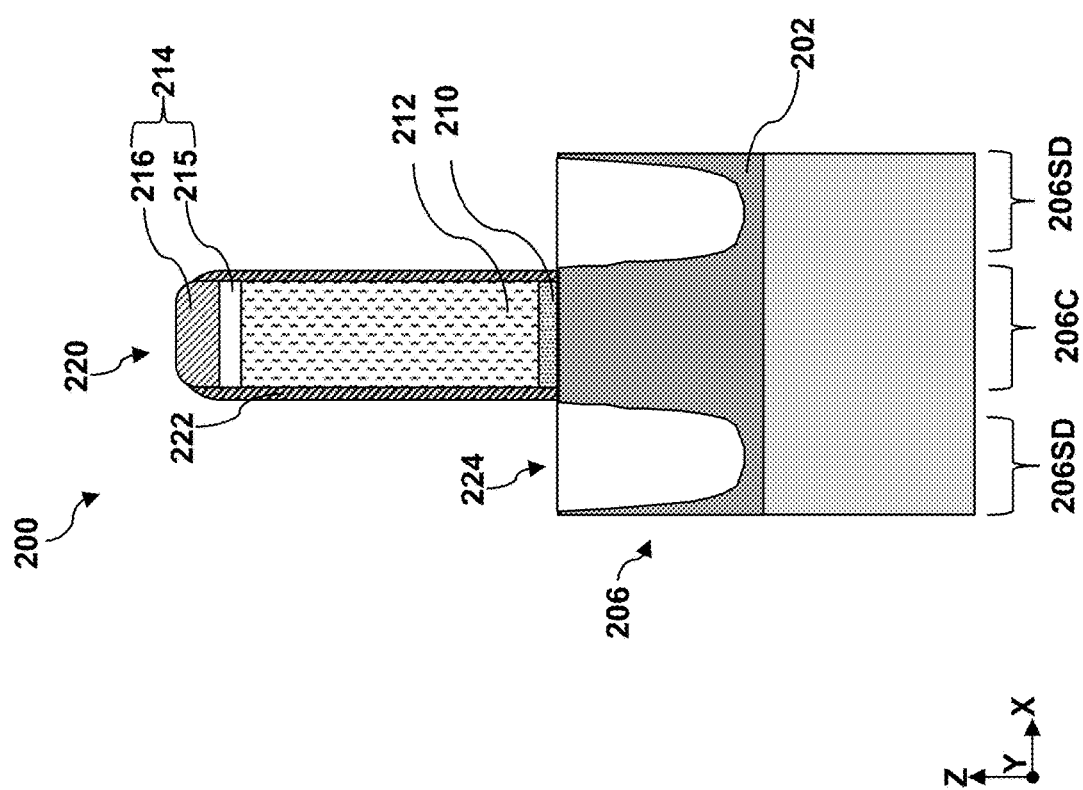

Referring to FIGS. 1 and 7, method 100 includes a block 110 where a source/drain region 206SD of the fin structure 206 is anisotropically recessed to form a source/drain trench 224 (or a source/drain recess 224). The anisotropic etch may include a dry etch or a suitable etch process that etches the epitaxial layer 202 in the source/drain regions 206SD. In some embodiments represented in FIG. 7, the resulting source/drain trench 224 extends vertically into the epitaxial layer 202, but does not extend into the substrate 201. The non-exposure of the substrate 201 prevents bare silicon (Si) surface of the substrate 201 from being a growth surface of any overlying silicon germanium (SiGe) epitaxial layers. However, in some alternative embodiments shown in FIGS. 18 and 19, the source/drain trench 224 is allowed to extend into the substrate 201. In those alternative embodiments, a diffusion stop layer is formed to a greater thickness to ensure satisfactory device performance. An example dry etch process for block 110 may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. As illustrated in FIG. 7, the source/drain regions 206SD of the fin structure 206 are recessed to expose sidewalls of the epitaxial layer 202 and a bottom surface of the epitaxial layer 202. After the source/drain trench 224 is formed, a wet etch or a cleaning process may be performed to remove debris, oxides, or fluorides from the bottom surface and sidewalls of the source/drain trench 224. This cleaning process ensures satisfactory epitaxial deposition of subsequent layers.

Figure 8:
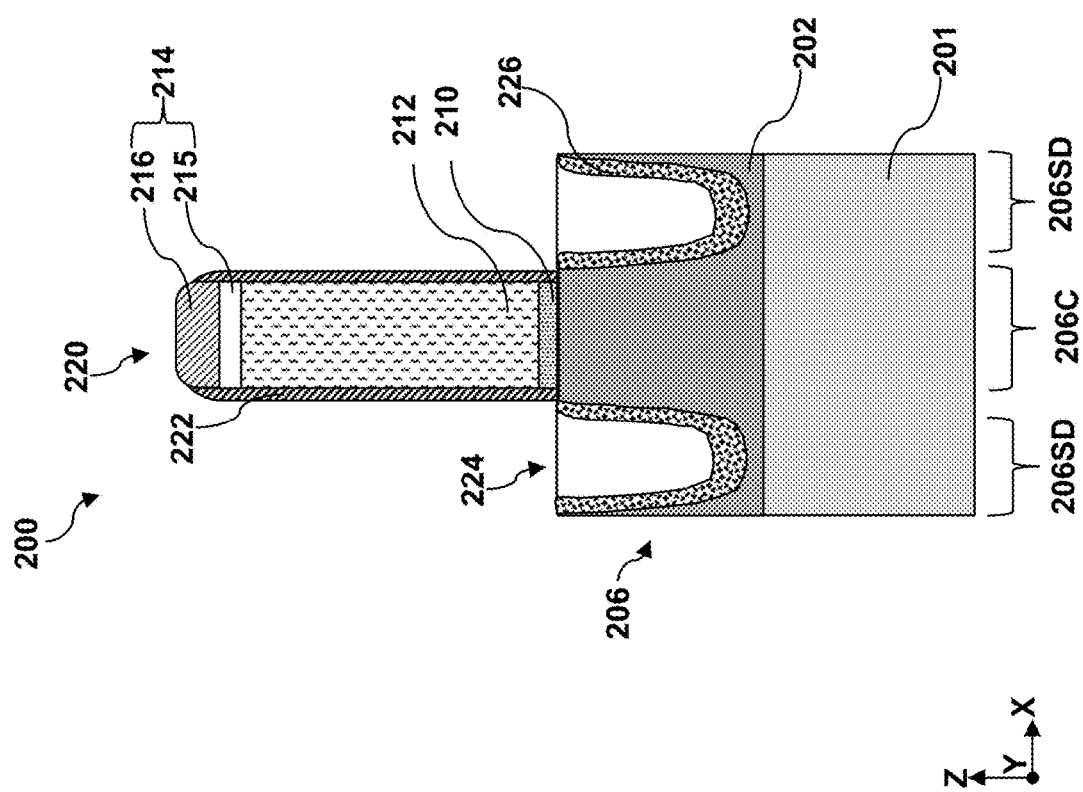
Figure 9:
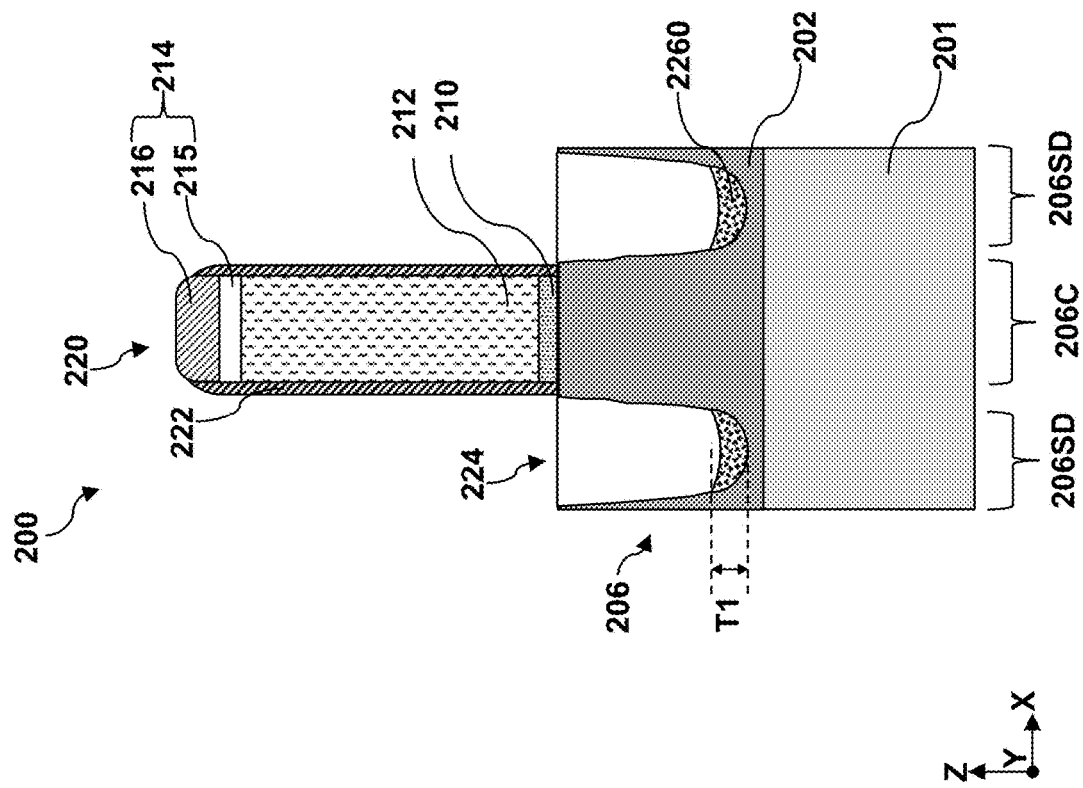

Referring to FIGS. 1, 8 and 9, method 100 includes a block 112 where a diffusion stop layer 2260 is formed on a bottom surface of the source/drain trench 224. Operations at block 112 may include conformal deposition of a semiconductor layer 226 over the source/drain trench 224 (shown in FIG. 8) and selective etch back of the deposited semiconductor layer 226 to form the diffusion stop layer (shown in FIG. 9). Referring to FIG. 8, the semiconductor layer 226 is deposited over the source/drain trench 224 in a conformal manner. The manner of deposition of the semiconductor layer 226 may be controlled by process temperature and supply of the precursors. When conformal deposition of the semiconductor layer 226 is desired, the deposition is configured such that the deposition along the [001] or [110] crystalline direction are substantially the same. In the embodiments illustrated in FIG. 8, the [001] crystalline direction is along the Z direction and the [110] crystalline direction is along the X direction.

In some embodiments, both the diffusion stop layer 2260 and the epitaxial layer 202 may include silicon germanium (SiGe), where a germanium content of the diffusion stop layer 2260 is greater than a germanium content of the epitaxial layer 202. In some instances, the germanium content in the diffusion stop layer 2260 may be between about 25% and about 35% while the germanium content in the epitaxial layer 202 may be between about 18% and about 25%. As will be described in further detail below, the germanium content of the diffusion stop layer 2260 is greater than a germanium content of a first epitaxial layer in the source/drain feature overlying the diffusion stop layer 2260. The semiconductor layer 226 may be deposited using vapor-phase epitaxy (VPE), ultra-high vacuum CVD (UHV-CVD), molecular beam epitaxy (MBE), and/or other suitable processes. In some instances, deposition of the semiconductor layer 226 may include use of silane, silane dichloride, germane, isobutyl germane, alkylgermanium trichloride, dimethylaminogermanium trichloride, or other silicon or germanium-containing precursors. In some embodiments where the multi-gate device is a p-type device and the diffusion stop layer 2260 is configured to slow down out-diffusion of boron (B) from overlying source/drain structures, the semiconductor layer 226 may be in-situ doped with phosphorus (P) or carbon (C). Here, because boron (B) is a p-type dopant and phosphorus (P) or carbon (C) is an n-type dopant, doping of phosphorus (P) or carbon (C) may be referred to as anti-doping. In these embodiments, the anti-doping concentration of phosphorus (P) or carbon (C) is between $5\times10^{18}$ atoms/cm$^3$ and about $5\times10^{20}$ atoms/cm$^3$. When the anti-doping concentration of phosphorus (P) or carbon (C) is smaller than $5\times10^{18}$ atoms/cm$^3$, the diffusion stop property of the diffusion stop layer 2260 may be similar to that of one without any intentional doping. That is, if the anti-doping concentration is smaller than $5\times10^{18}$ atoms/cm$^3$, the anti-doping concentration would be so insignificant that one might as well implement an undoped semiconductor layer 226 instead and omit all the in-situ doping steps. When the anti-doping concentration of phosphorus (P) or carbon (C) is greater than $5\times10^{20}$ atoms/cm$^3$, the anti-doping concentration may lead to defects in epitaxial layers formed on the diffusion stop layer 2260, impacting the performance of the resulting device.

It is noted while a p-type multi-gate device is illustrated in the drawings, embodiments of the present disclosure may be implemented in an n-type multi-gate device. Because the diffusion stop layer 2260 is formed of silicon germanium (SiGe), the larger-than-silicon germanium atoms may function to slow down out-diffusion of n-type dopants, such as phosphorus (P) or arsenic (As), in n-type source/drain features. Additionally, silicon germanium (SiGe) in the diffusion stop layer 2260 may operate to provide tensile stress to improve carrier mobility in channels of the n-type multi-gate device. When the diffusion stop layer 2260 is implemented in an n-type multi-gate device, the diffusion stop layer 2260 may be in-situ doped with carbon (C) to further slow down the out-diffusion of phosphorus (P). When the diffusion stop layer 2260 is doped with carbon (C), the diffusion stop layer 2260 is formed of SiGe:C. When doped with carbon (C), a carbon doping concentration in the diffusion stop layer 2260 may be between $5\times10^{18}$ atoms/cm$^3$ and about $5\times10^{20}$ atoms/cm$^3$.

As will be described further below, the p-type source/drain feature overlying the diffusion stop layer 2260 is doped with a p-type dopant, such as boron (B). While the diffusion stop layer 2260 may slow down the out-diffusion of boron (B) from the overlying source/drain feature, some boron (B) may diffuse in the diffusion stop layer 2260. In some embodiments, besides phosphorus (P) and/or carbon (C), the diffusion stop layer 2260 may include boron (B) in the final structure. In some instances, a boron doping concentration in the diffusion stop layer 2260 may be smaller than $2\times10^{20}$ atoms/cm$^3$, such as between about $1\times10^{18}$ atoms/cm$^3$ and about $2\times10^{20}$ atoms/cm$^3$. While not explicitly shown, when the diffusion stop layer 2260 is implemented in an n-type multi-gate transistor, such as an n-type FinFET or an n-type MBC transistor, some phosphorus (P) may diffuse into the diffusion stop layer 2260. As a result, a diffusion stop layer 2260 in an n-type multi-gate device may include phosphorus (P) at a concentration smaller than about $1\times10^{20}$ atoms/cm$^3$, such as between about $1\times10^{18}$ atoms/cm$^3$ and about $1\times10^{20}$ atoms/cm$^3$.

After the semiconductor layer 226 is deposited as shown in FIG. 8, the semiconductor layer 226 is etched back to form the diffusion stop layer 2260 as shown in FIG. 9. The etch back at block 112 may be regarded as selective or directional because it is configured to etch the semiconductor layer 226 faster along the [110] crystalline direction than along the [100] direction. As deposited, the semiconductor layer 226 has a [100] crystalline direction (or [001] direction) along the Z direction and a [110] crystalline direction along the X direction or along the Y direction. That is, the etch back is configured to laterally etch away the semiconductor layer 226 disposed along the sidewall of the source/drain recess 224 but etch the semiconductor layer 226 on the bottom surface of the source/drain trench 224 at a slower rate. This uneven etch may be referred to as a lateral etch bias. In some instances, a ratio of the etch rate along the [110] direction to the etch rate along the [100] direction may be between about 2 and about 20. The lateral etch bias explains how the semiconductor layer 226 is patterned in the selective etch back to form the diffusion stop layer 2260 shown in FIG. 9. Due to lateral etch bias, substantially all of the semiconductor layer 226 on the sidewalls of the source/drain trench 224 is removed while a portion of the semiconductor layer 226 on the bottom surface of the source/drain trench 224 is left behind to form the diffusion stop layer 2260.

In some instances, after the etch back, the diffusion stop layer 2260 may have a first thickness T1 between about 0.5 nm and about 20 nm. This thickness range is critical. When the first thickness T1 of the diffusion stop layer 2260 is smaller than 0.5 nm, the diffusion stop layer 2260 may not have sufficient thickness to slow down the out-diffusion of boron (B) (or phosphorus (P) for an n-type multi-gate transistor). Additionally, as will be described below, when the first thickness T1 of the diffusion stop layer 2260 is smaller than 0.5 nm, two adjacent source/drain features may not have a sufficiently high merge height to result in reduction of parasitic capacitance. When the first thickness T1 of the diffusion stop layer 2260 is greater than 20 nm, the diffusion stop layer 2260 may necessitate a deep source/drain trench 224 to accommodate the source/drain feature. There are challenges associated with forming deep source/drain trench 224. First, a deep source/drain trench 224 may extend into and expose a portion of the substrate 201, which may be formed of silicon (Si), instead of silicon germanium (SiGe). Because the semiconductor layer 226 and overlying epitaxial layers are all formed of silicon germanium (SiGe), a bare silicon surface may lead to undesirably high crystalline defects. Second, there is a limit as to the thickness of the epitaxial layer 202. Because the lattice mismatch between silicon (Si) in the substrate 201 and silicon germanium (SiGe) in the epitaxial layer 202 increases with the thickness of the epitaxial layer 202, when the epitaxial layer 202 reaches a thickness between about 60 nm and about 70 nm, the quality of the epitaxial layer 202 can no longer be maintained and the defect density in the epitaxial layer 202 may be too high. Third, it is difficult to form a deep high-aspect-ratio source/drain trench with good control of bottom profile. For at least these three reasons, the thickness of the diffusion stop layer 2260 should be smaller than 20 nm in some embodiments to avoid an overly deep source/drain trench 224 or inferior crystalline quality of the epitaxial layer 202.

In some alternative embodiments to be described further below, the source/drain trench 224 may be allowed to extend into the substrate 201 and a thicker diffusion stop layer 2260 is deposited over the exposed portion of the substrate 201. In those alternative embodiments, the thicker diffusion stop layer 2260 serves at least two purposes. First, it allows the lattice mismatch between silicon (Si) and silicon germanium (SiGe) to dissipate and provides a defect-less surface for further deposition of various epitaxial layers in the source/drain features. Second, its thickness allows it to better cover the exposed portion of the substrate 201 to prevent dopant out-diffusion and leakage.

The etch back at block 112 may include etchant gas species such as hydrogen chloride (HCl), chlorine ($Cl_2$), hydrogen bromide (HBr), hydrogen fluoride (HF), nitrogen trifluoride ($NF_3$), amine, carbon fluoride, sulfur fluoride, argon, or carbonyl sulfide (COS). The etch back may also include use of one or more carrier gas, such as hydrogen ($H_2$), nitrogen ($N_2$), helium (He), or oxygen ($O_2$). In one embodiment, the etchant gas is hydrogen chloride and the carrier gas is hydrogen. To achieve the desired lateral etch bias described above, the etch back process at block 112 include a high process temperature and low process pressure. In some embodiments, the high process temperature may be between about 500° C. and about 800° C. and the low process pressure may be between about 5 torr and about 350 torr. In one embodiment, the etch back process at block 112 includes use of hydrogen chloride (HCl) at a flow rate between about 30 standard cubic centimeters per minute (SCCM) and about 3000 SCCM.

Figure 10:
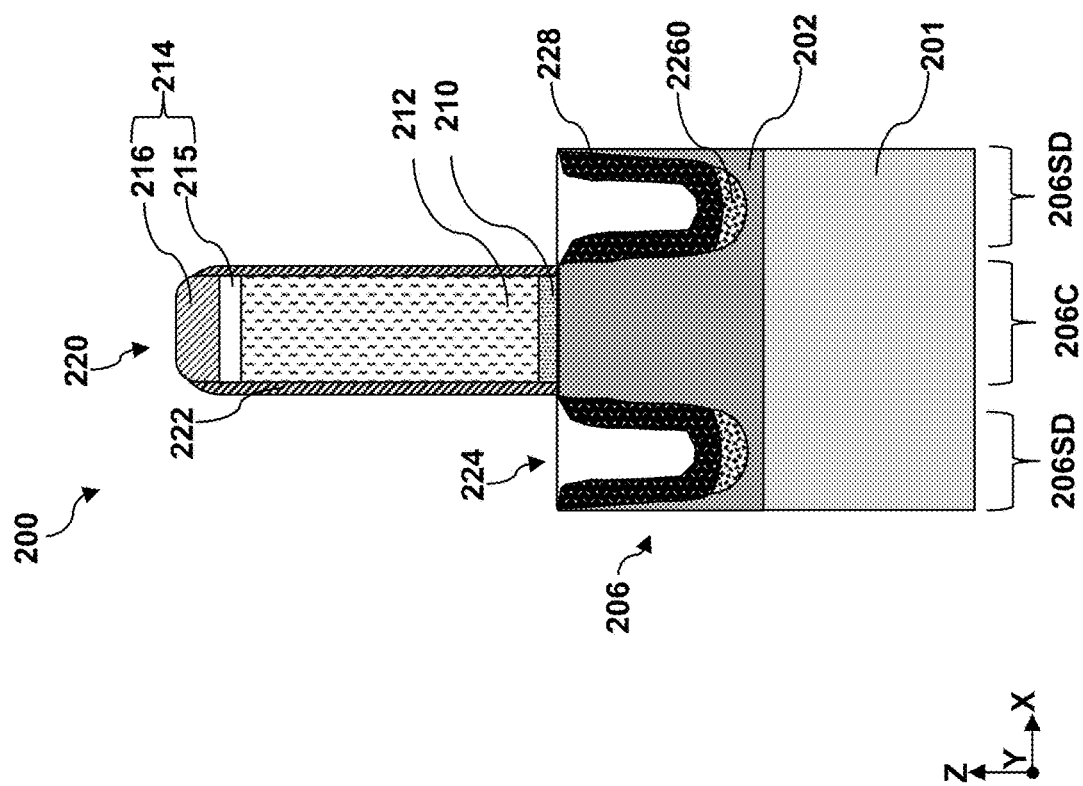

Referring to FIGS. 1 and 10, method 100 includes a block 114 where a first epitaxial layer 228 is selectively deposited over a top surface of the diffusion stop layer 2260 and exposed sidewalls of the source/drain trench 224. In some embodiments, the first epitaxial layer 228 may be deposited using vapor-phase epitaxy (VPE), ultra-high vacuum CVD (UHV-CVD), molecular beam epitaxy (MBE), and/or other suitable processes. In some embodiments, the first epitaxial layer 228 may include silicon germanium (SiGe) and may be deposited using precursors such as silane, silane dichloride, germane, isobutyl germane, alkylgermanium trichloride, dimethylaminogermanium trichloride, or other silicon or germanium-containing precursors. The first epitaxial layer 228 may be in-situ doped with a p-type dopant, such as boron (B). In some embodiments, the first epitaxial layer 228 may include a boron doping concentration between about $2\times10^{20}$ atoms/$cm^3$ and about $1\times10^{21}$ atoms/$cm^3$. In order for the diffusion stop layer 2260 to function as a dopant blocker, a germanium content in the first epitaxial layer 228 is smaller than the germanium content in the diffusion stop layer 2260. In some embodiments, the germanium content in the diffusion stop layer 2260 is between about 25% and 35% while the germanium content in the first epitaxial layer 228 is between about 20% and 30%. In some embodiments, the germanium content in the first epitaxial layer 228 gradually increases from the interface between the diffusion stop layer 2260 and the first epitaxial layer 228. At least at that interface, a germanium content difference between the diffusion stop layer 2260 and the first epitaxial layer 228 may be greater than about 5%, such as between about 5% and 10%. When the germanium content difference is smaller than 5%, the diffusion blocking property of the diffusion stop layer 2260 may be too insignificant, especially in consideration of the process variations. Along the vertical direction (Z direction), the diffusion stop layer 2260 is disposed directly between the underlying epitaxial layer 202 and the overlying first epitaxial layer 228. Because the germanium content of the diffusion stop layer 2260 is greater than that in the epitaxial layer 202 or the first epitaxial layer 228, the diffusion stop layer 2260 creates a local germanium content spike between the epitaxial layer 202 and the first epitaxial layer 228. According to the present disclosure, this local germanium content spike is intentional because experimental result show that it helps slow down the diffusion of dopants (like boron (B)) in the first epitaxial layer 228 into the epitaxial layer 202 or the substrate 201.

Figure 11:
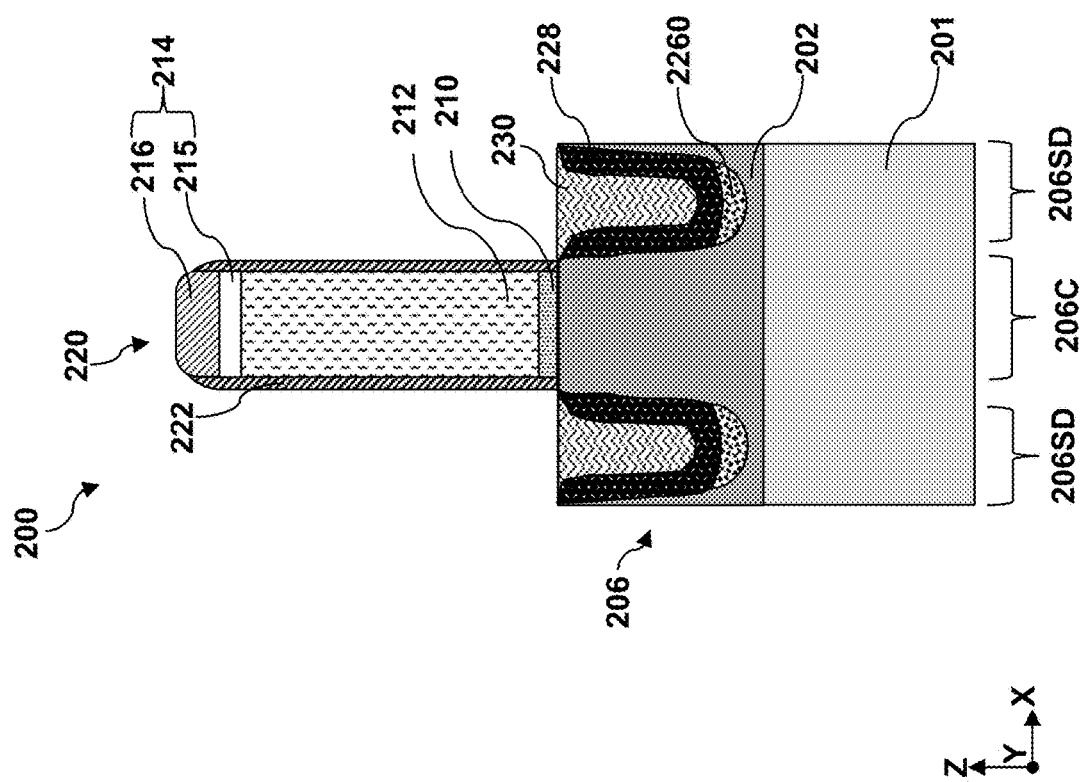

Referring to FIGS. 1 and 11, method 100 includes a block 116 where a second epitaxial layer 230 is deposited over surfaces of the first epitaxial layer 228. As shown in FIG. 11, because the first epitaxial layer 228 is in direct contact with the diffusion stop layer 2260 and the sidewalls of the source/drain trench 224 while the second epitaxial layer 230 is spaced apart therefrom, the first epitaxial layer 228 may also be referred to as an outer layer 228 or an outer epitaxial layer 228 and the second epitaxial layer 230 may also be referred to as an inner layer 230 or an inner epitaxial layer 230. In some embodiments, the second epitaxial layer 230 may be deposited using vapor-phase epitaxy (VPE), ultra-high vacuum CVD (UHV-CVD), molecular beam epitaxy (MBE), and/or other suitable processes. The second epitaxial layer 230 may include silicon germanium (SiGe) and may be deposited using precursors such as silane, silane dichloride, germane, isobutyl germane, alkylgermanium trichloride, dimethylaminogermanium trichloride, or other silicon or germanium-containing precursors. Different from the first epitaxial layer 228, the second epitaxial layer 230 is a heavily doped semiconductor layer to reduce parasitic resistance. When a p-type FinFET is intended, the second epitaxial layer 230 may be doped with boron (B) with a dopant concentration between about $5 \times 10^{20}$ and about $1.5 \times 10^{21}$ atoms/cm$^3$. A germanium content of the second epitaxial layer 230 is greater than the germanium content of the diffusion stop layer 2260. In some embodiments, the germanium content of the second epitaxial layer 230 is between about 32% and about 55%. The high germanium content in the second epitaxial layer 230 functions to strain the channel region for improved carrier mobility.

Figure 12:
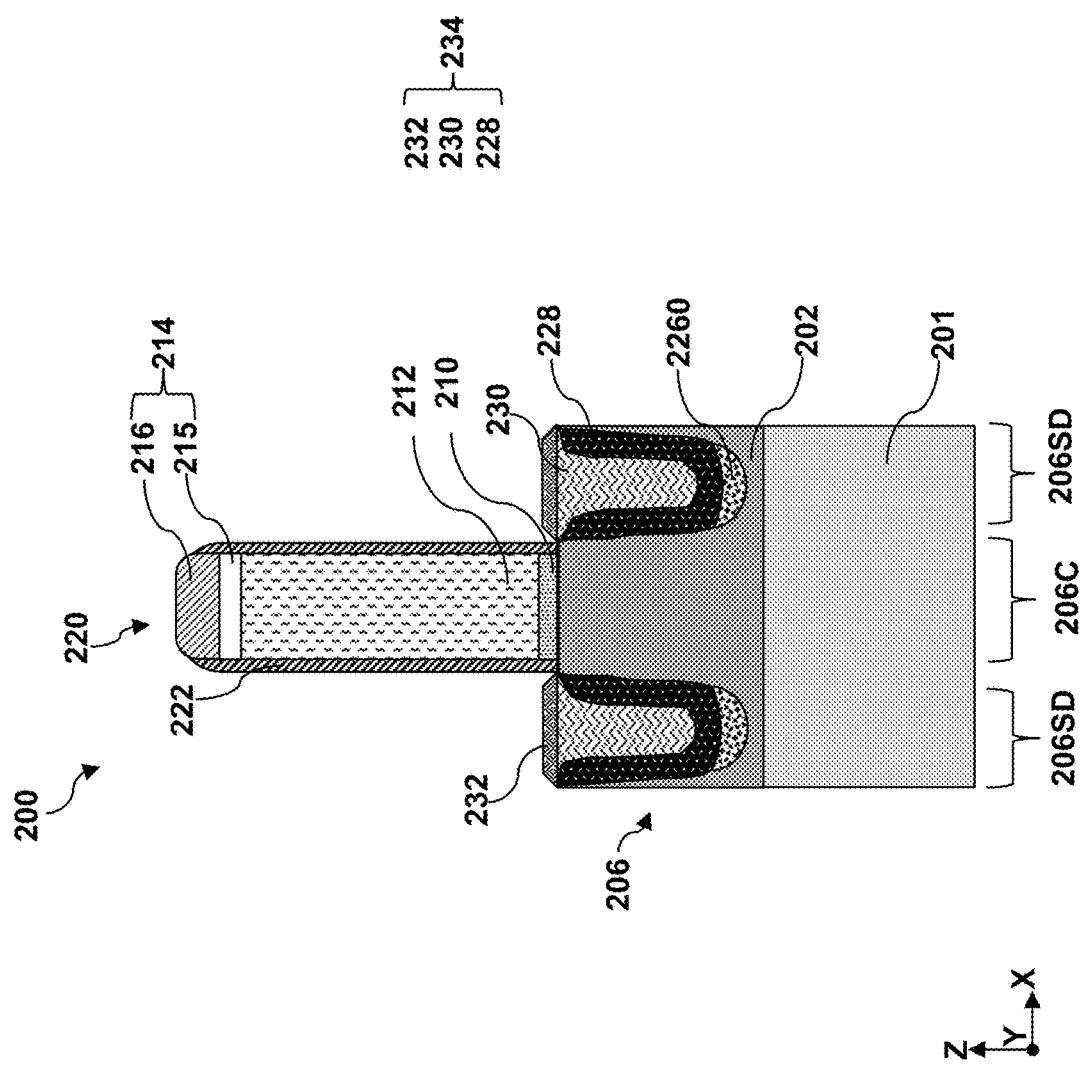

Referring to FIGS. 1 and 12, method 100 includes a block 118 where a third epitaxial layer 232 is deposited over top surfaces of the second epitaxial layer 230. In some embodiments, the third epitaxial layer 232 may be deposited using vapor-phase epitaxy (VPE), ultra-high vacuum CVD (UHV-CVD), molecular beam epitaxy (MBE), and/or other suitable processes. The third epitaxial layer 232 may include silicon germanium (SiGe) and may be deposited using precursors such as silane, silane dichloride, germane, isobutyl germane, alkylgermanium trichloride, dimethylaminogermanium trichloride, or other silicon or germanium-containing precursors. The third epitaxial layer 232 serves as a capping epitaxial layer to prevent dopant in the second epitaxial layer 230 from diffusing into adjacent structures before source/drain contacts are formed. To properly serve as a capping epitaxial layer, the third epitaxial layer 232 may be doped with boron (B), albeit at a dopant concentration smaller than that in the second epitaxial layer 230. It is observed that a lower dopant concentration makes the third epitaxial layer 232 more etch resistant and prevent dopant diffusion to overlying layers. In some instances, the third epitaxial layer 232 may have a dopant concentration between about $1 \times 10^{20}$ and about $4.5 \times 10^{20}$ atoms/cm$^3$.

Referring to FIG. 12, the first epitaxial layer 228, the second epitaxial layer 230 and the third epitaxial layer 232 over the diffusion stop layer 2260 may be collectively referred to as a source/drain feature 234. The source/drain feature 234 interfaces sidewalls of the channel region 206C of the fin structure 206 and a top surface of the diffusion stop layer 2260 by way of the first epitaxial layer 228. The second epitaxial layer 230 is spaced apart from the sidewalls of the channel regions 206C of the fin structure 206 and the top surface of the diffusion stop layer 2260 by the first epitaxial layer 228.

Figure 13:
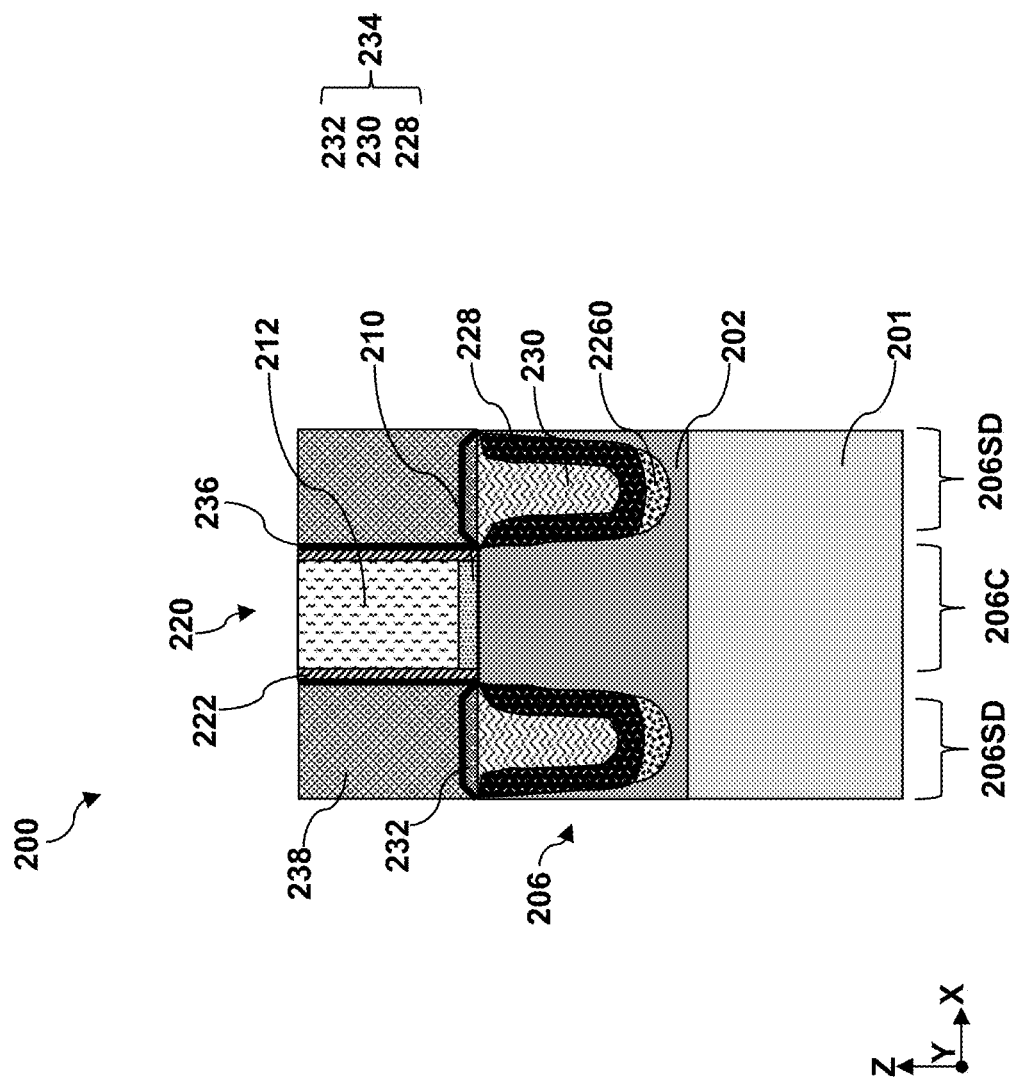
Figure 14:
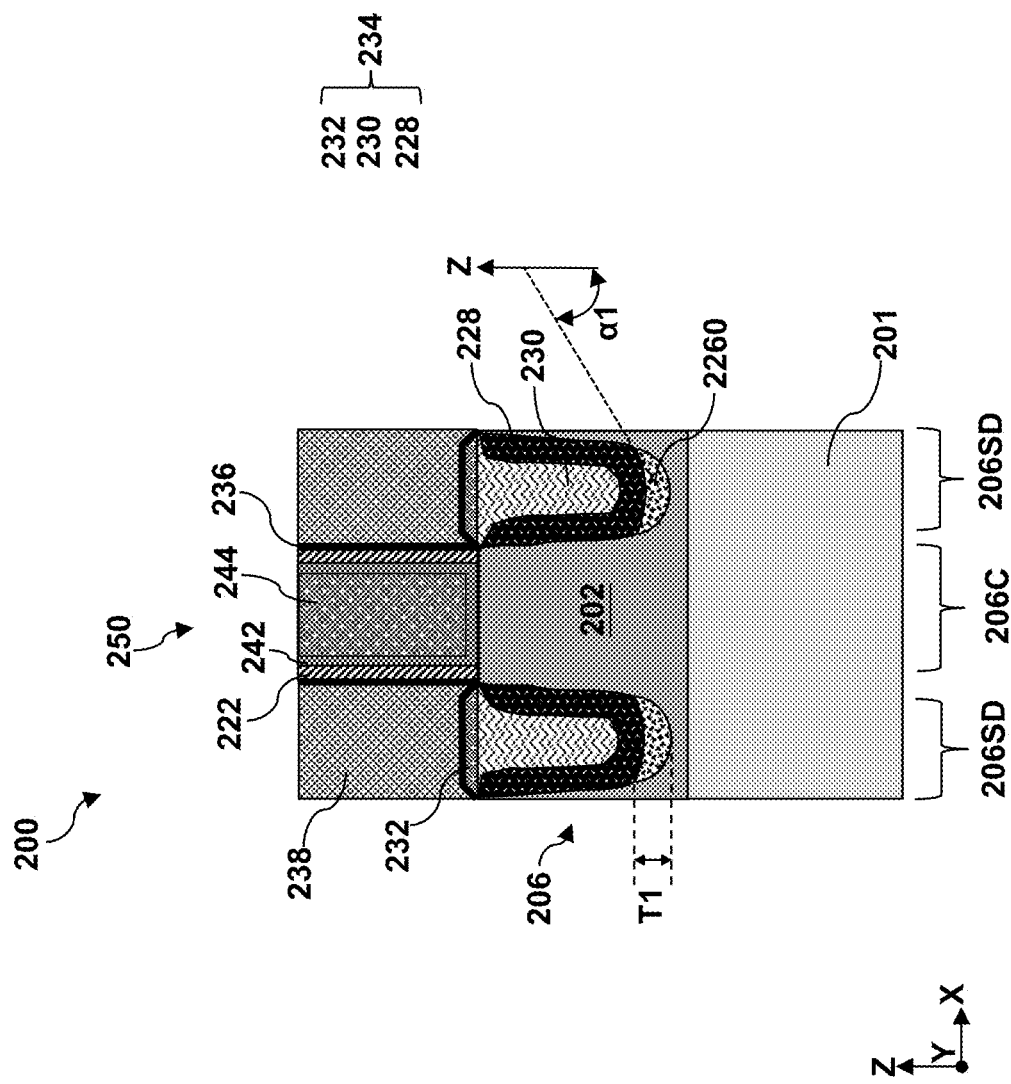

Referring to FIGS. 1 and 13-14, method 100 includes a block 120 where the dummy gate stack 220 is replaced with a gate structure 250. Block 120 may include deposition of a contact etch stop layer (CESL) 236 over the third epitaxial layer 232 and an interlayer dielectric (ILD) layer 238 over the CESL 236 (shown in FIG. 13), removal of the dummy gate stack 220 (shown in FIG. 13), and formation of the gate structure 250 to wrap over of the channel region 206C of the fin structure 206 (shown in FIG. 14). The CESL 236 may be deposited over the workpiece 200 using ALD or CVD and may include silicon nitride or silicon carbonitride. The ILD layer 238 is deposited over the workpiece 200, including over the CESL 236, using CVD, FCVD, spin-on coating, or a suitable deposition technique. In some embodiments, the ILD layer 238 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. After the deposition of the ILD layer 238, the workpiece 200 may be planarized by a planarization process to expose the dummy gate stack 220. For example, the planarization process may include a chemical mechanical planarization (CMP) process. Exposure of the dummy gate stack 220 allows the removal of the dummy gate stack 220.

Referring to FIG. 14, the dummy gate stack 220 is then removed and replaced with the gate structure 250. The removal of the dummy gate stack 220 may include one or more etching processes that are selective to the material of the dummy gate stack 220. For example, the removal of the dummy gate stack 220 may be performed using a selective wet etch, a selective dry etch, or a combination thereof that is selective to the dummy gate stack 220.

After the removal of the dummy gate stack, the gate structure 250 is formed to wrap over the channel region 206C of the fin structure. While not explicitly shown, the gate structure 250 includes an interfacial layer interfacing the top surface and sidewalls of the channel region 206C of the fin structure 206, a gate dielectric layer 242 over the interfacial layer, and a gate electrode layer 244 over the gate dielectric layer 242. The interfacial layer may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The gate dielectric layer 242 may include a high-k dielectric material, such as hafnium oxide. Alternatively, the gate dielectric layer may include other high-K dielectric materials, such as titanium oxide (TiO$_2$), hafnium zirconium oxide (HfZrO), tantalum oxide (Ta$_2$O$_5$), hafnium silicon oxide (HfSiO$_4$), zirconium oxide (ZrO$_2$), zirconium silicon oxide (ZrSiO$_2$), lanthanum oxide (La$_2$O$_3$), aluminum oxide (Al$_2$O$_3$), zirconium oxide (ZrO), yttrium oxide (Y$_2$O$_3$), SrTiO$_3$ (STO), BaTiO$_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)TiO$_3$ (BST), silicon nitride (SiN), silicon oxynitride (SiON), combinations thereof, or other suitable material. The gate dielectric layer may be formed by ALD, physical vapor deposition (PVD), CVD, oxidation, and/or other suitable methods.

The gate electrode layer 244 of the gate structure 250 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. In various embodiments, the gate electrode layer may be formed by ALD, PVD, CVD, e-beam evaporation, or other suitable process. In various embodiments, a CMP process may be performed to remove excessive metal, thereby providing a substantially planar top surface of the gate structure. Because the gate structure 250 includes metal layers and high-k gate dielectric layer, the gate structure 250 may also be referred to as a metal gate structure 250 or high-k metal gate structure 250.

Figure 15:
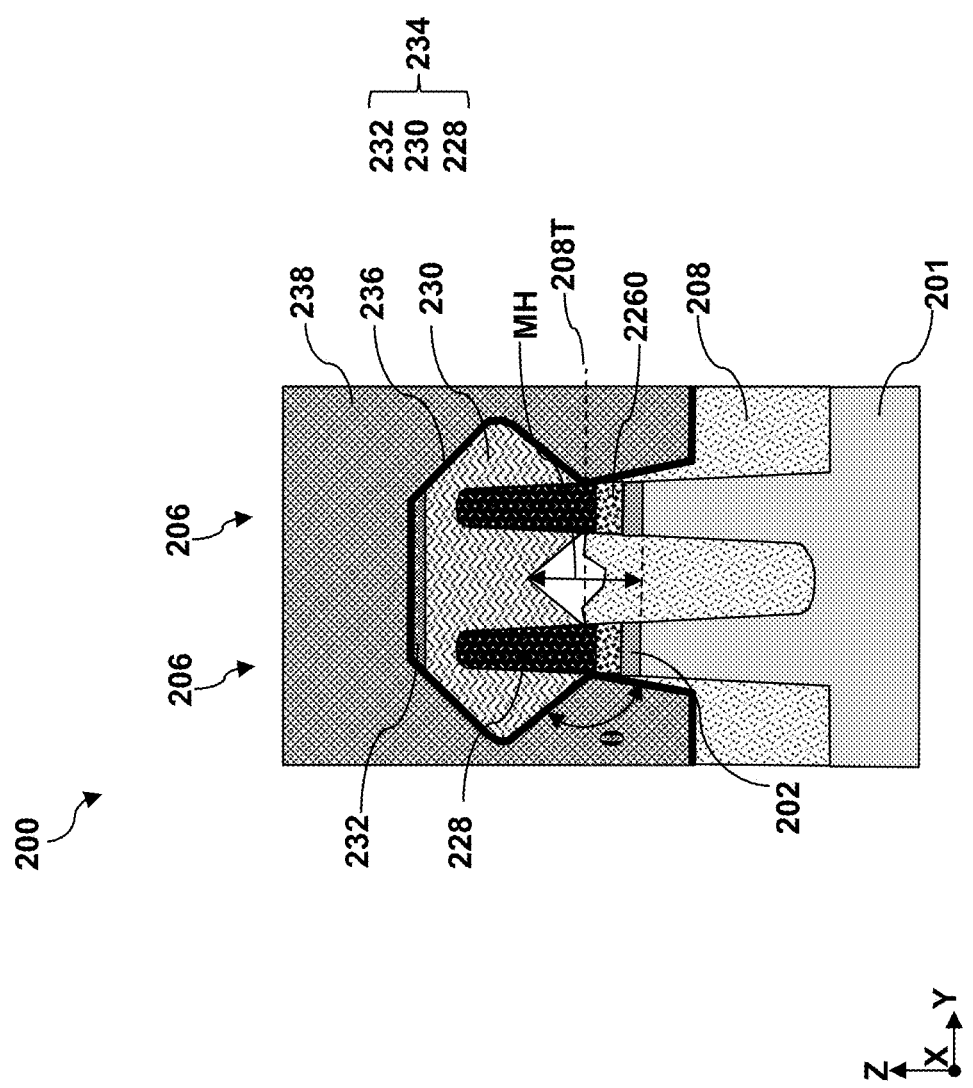

FIG. 15 illustrates a cross-sectional view of the source/drain feature 234 along the X direction, which is perpendicular to the Y direction. As shown in FIG. 15, when the source/drain features 234 are formed over two adjacent fin structures 206, they may merge over the top surface 208T of the isolation feature 208 between the two adjacent fin structures 206. As shown in FIG. 15, the diffusion stop layer 2260 has a thickness between about 5 nm and about 20 nm, which may change the profile of the source/drain feature 234 to reduce parasitic capacitance between the source/drain feature 234 and the gate structure 250. Due to the presence of the diffusion stop layer 2260, the departing angle θ measured between the sidewall of the isolation feature 208 and the downward facing surface of the second epitaxial layer 230 may be increased from between about 135° and about 145° without the diffusion stop layer 2260 to between 150° and about 160° with the diffusion stop layer 2260 according to the present disclosure. Additionally, the merged source/drain features 234 include a merge height MH measured from a top surface of the substrate 201 to a bottom surface of the merged portion of the source/drain feature 234. The merge height MH is increased from between about 18 nm and about 21 nm without the diffusion stop layer 2260 to between about 22 nm and about 25 nm with the diffusion stop layer 2260. The increase of the departing angle θ and the merge height MH reduce the areal overlap between the source/drain features 234 and the adjacent gate structure 250 (shown in FIG. 14), thereby reducing the parasitic capacitance.

Figure 16:
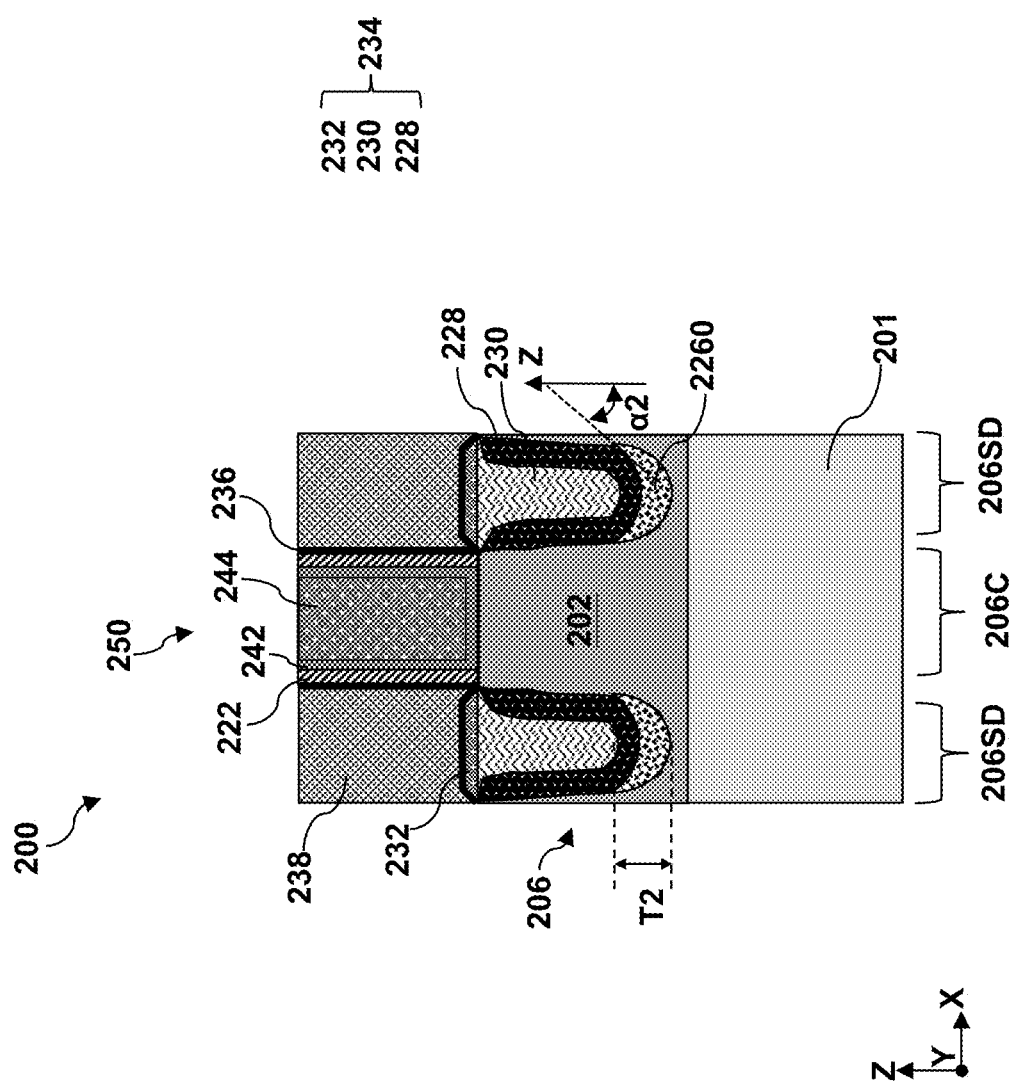
FIGS. 16-19 illustrate fragmentary cross-sectional views of a semiconductor structure according to various alternative embodiments of the present disclosure.
Figure 17:
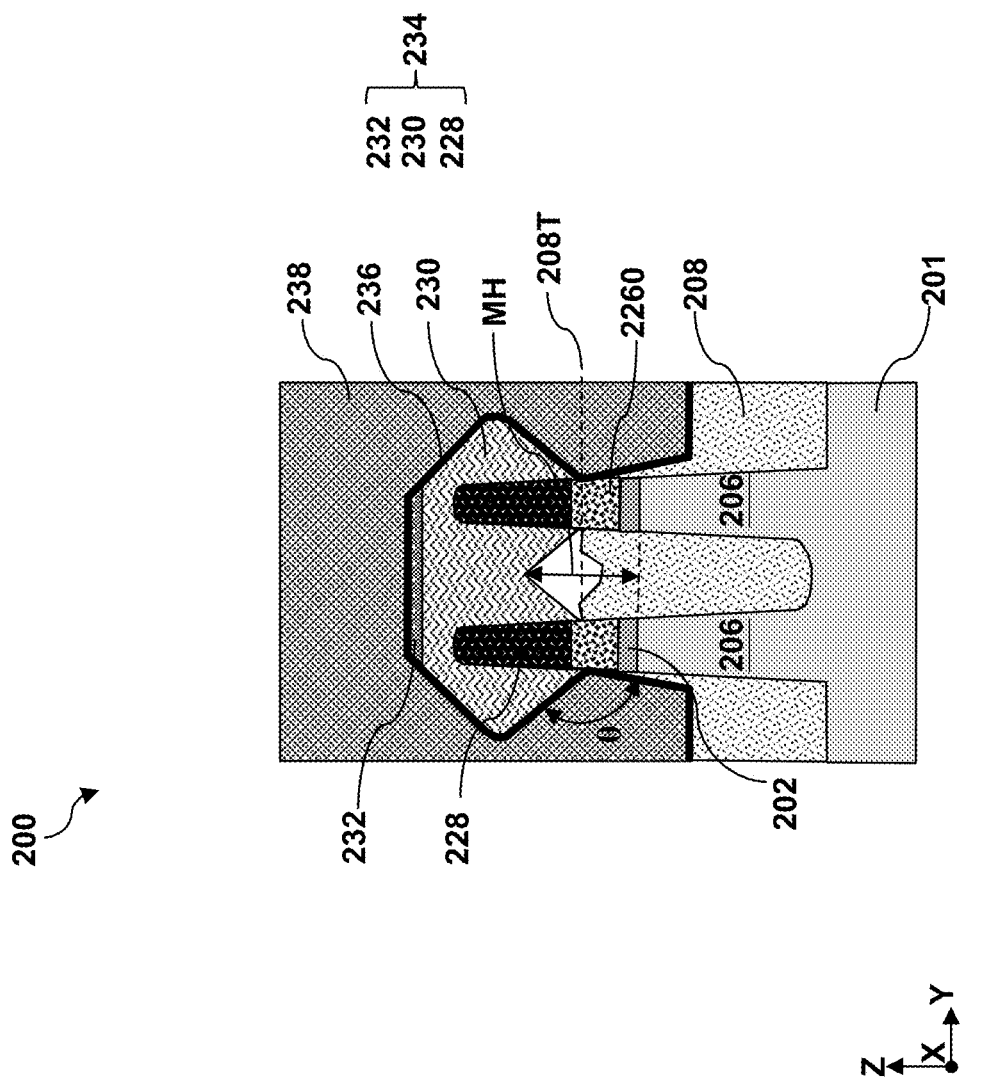

While the method 100 is described in conjunction with cross-sectional views of the workpiece 200 shown in FIGS. 2-15, structures different from those shown in FIG. 15 may be formed using method 100. Example structures according to some alternative embodiments are illustrated in FIGS. 16-19. Referring first to FIG. 16, when a low level of leakage or very low off-state current is desired, the diffusion stop layer 2260 may have a bowl-like cross-sectional profile shown in FIG. 16, rather than a dish-like cross-sectional profile shown in FIG. 14. To form the bowl-like diffusion stop layer 2260, the etch back at block 112 is performed for a shorter period of time or a lesser extent such that more semiconductor layer 226 is left on the bottom surface of the source/drain trench 224. Because a bottom surface of the source/drain trench 224 may be curved, a thicker diffusion stop layer 2260 may have edges that curve more upward, which reduces leakage into the substrate 201 at an angle. When the diffusion stop layer 2260 has a dish-like profile as shown in FIG. 14, a top surface of an edge portion of the diffusion stop layer 2260 forms a first profile angle α1 with the vertical direction (i.e., the Z direction) and the first profile angle α1 is greater than 30°, such as between about 60° and about 80°. When the diffusion stop layer 2260 has a bowl-like profile as shown in FIG. 16, a top surface of an edge portion of the diffusion stop layer 2260 forms a second profile angle α2 with the vertical direction (i.e., the Z direction) and the second profile angle α2 is equal to or smaller than 30°, such as between about 15° and about 30°. As shown in FIG. 16, in these example alternative embodiments, the vertical thicker diffusion stop layer reduces leakage along the vertical direction and the curved-up edge provide additional lateral diffusion stoppage. As described above with regards to FIG. 9 or 14, the dish-like diffusion stop layer 2260 has a first thickness T1 between about 0.5 nm and about 20 nm. As compared to the dish-like diffusion stop layer 2260 in FIG. 14, the bowl-like diffusion stop layer 2260 has a second thickness T2 between about 2 nm and 25 nm. The second thickness T2 is greater than the first thickness T1. When the diffusion stop layer 2260 is thinner and has a dish-like profile as shown in FIG. 15, a top surface of the diffusion stop layer 2260 may be lower than a top surface 208T of the isolation feature 208. When the diffusion stop layer 2260 is thicker and has a bowl-like profile as shown in FIG. 17, a top surface of the diffusion stop layer 2260 may be higher than a top surface 208T of the isolation feature 208.

Figure 18:
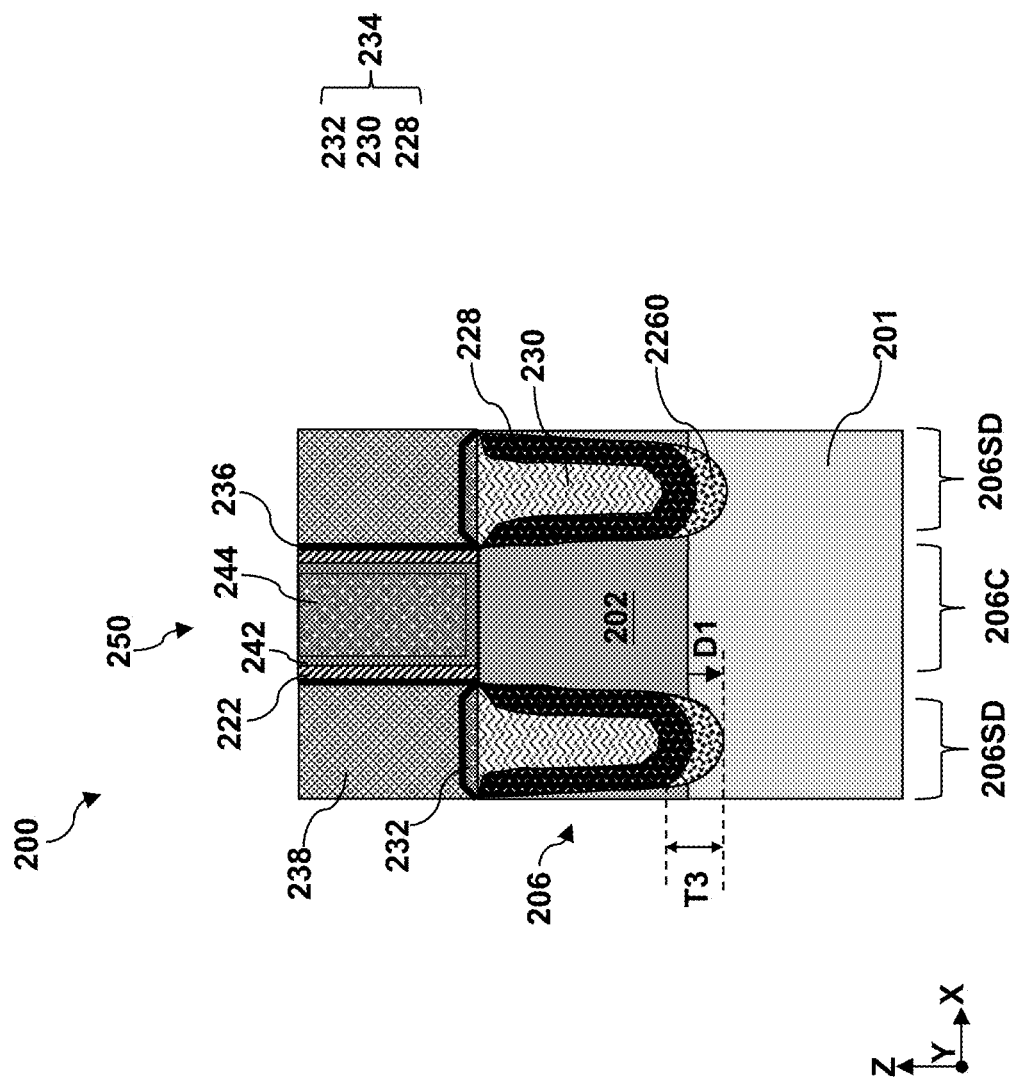
Figure 19:
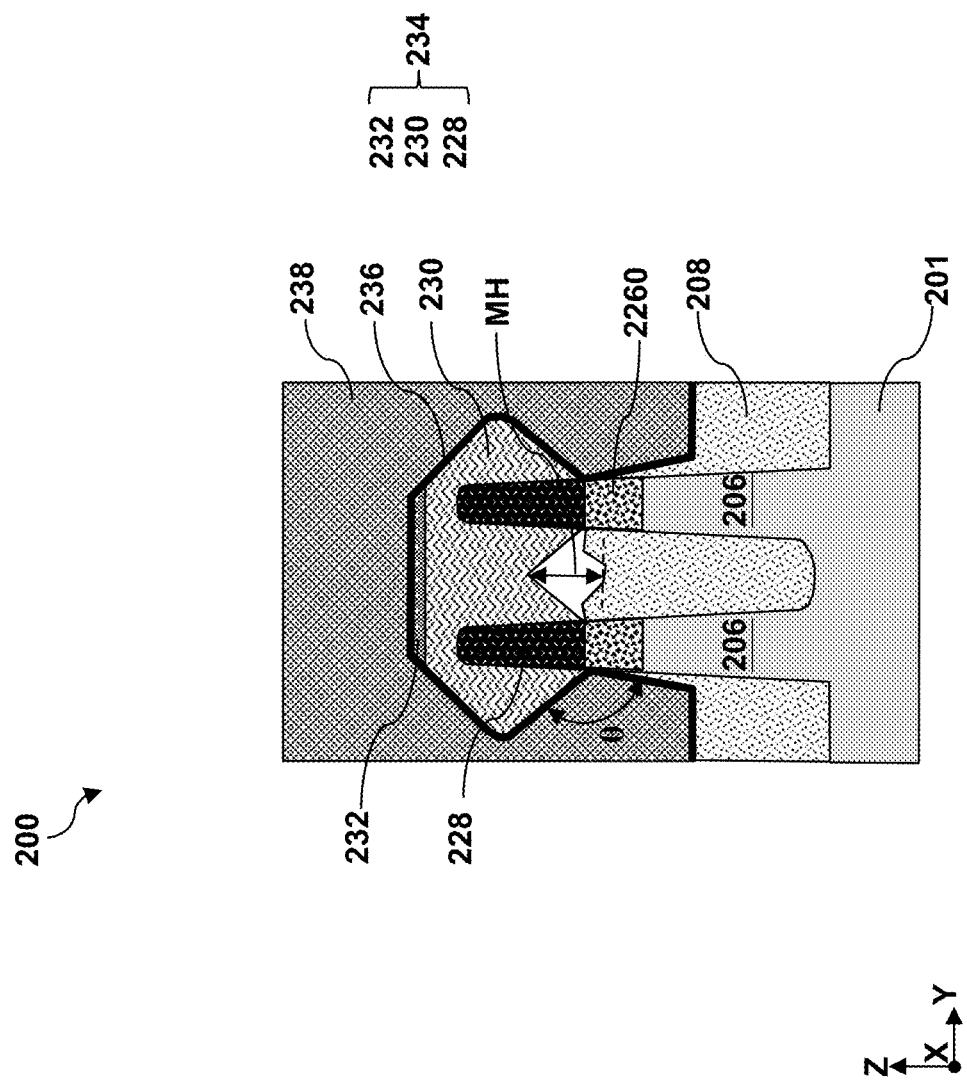

FIGS. 18 and 19 illustrate alternative embodiments where the source/drain trench 224 is allowed to extend into the substrate 201 and expose a portion of the substrate 201 and a portion of the diffusion stop layer 2260 extends into the substrate 201. As described above with respect to the operations at block 110, in some embodiments, the source/drain trench 224 does not extend through the epitaxial layer 202 because doing so may lower the quality of the source/drain feature 234 and may increase the leakage through the substrate 201. In the alternative embodiments shown in FIGS. 18 and 19, the source/drain trench 224 is intentionally formed deeper to extend partially into the substrate 201. Such a deep source/drain trench 224 allows sufficient volume of the more conductive second epitaxial layer 230 without sacrificing the thickness of the diffusion stop layer 2260. In some instances, such a deep source/drain trench 224 enables thicker diffusion stop layer 2260 for lower leakage current. In some embodiments represented in FIG. 18, the diffusion stop layer 2260 has a third thickness T3, which is greater than the second thickness T2 or the first thickness T1. In some instances, the third thickness T3 is between about 15 nm and about 30 nm. When the third thickness T3 is smaller than 15 nm, the lattice strain at the interface of the diffusion stop layer 2260 and the substrate 201 is unable to dissipate and quality of the source/drain feature 234 may suffer. When the third thickness T3 is greater than 30 nm, it is difficult to form the deep source/drain trench 224 that has such a high aspect ratio and the source/drain feature 234 may partially extend below a top surface of the substrate 201, which may increase the leakage risk. As shown in FIG. 18, in these alternative embodiments, a portion of the diffusion stop layer 2260 may extend below the top surface of the substrate 201 by a first depth D1. In some instances, the first depth D1 is between about 5 nm and about 20 nm.

The foregoing description and illustrations in FIGS. 2-19 demonstrate that the diffusion stop layer 2260 of the present disclosure may be implemented in a fin-type field effect transistor (FinFET). A similar diffusion stop layer may be implemented in an MBC transistor shown in FIG. 33. FIG. 20 illustrates a method 300 for forming a diffusion stop layer in an MBC transistor and various aspects of the method 300 are described in conjunction with FIG. 21-33, which include cross-sectional view of a workpiece 400.

Figure 21:
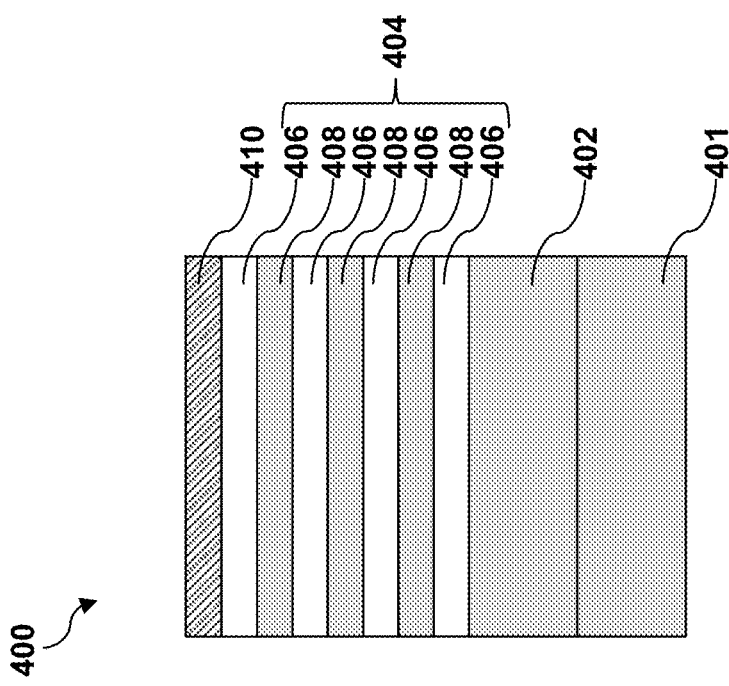
FIGS. 21-33 illustrate fragmentary cross-sectional views of a workpiece during a fabrication process according to the method 300 of FIG. 20, according to one or more aspects of the present disclosure.

Referring to FIGS. 20 and 21, method 300 includes a block 302 where a stack 404 of alternating semiconductor layers is formed over the workpiece 400. As shown in FIG. 21, the workpiece 400 includes a substrate 401 and an epitaxial layer 402 disposed directly on the substrate 401. In some embodiments, the substrate 401 may be a semiconductor substrate such as a silicon (Si), germanium (Ge), or a silicon germanium (SiGe) substrate. In one embodiment, the substrate 201 is a silicon (Si) substrate. The substrate 401 may include various doping configurations depending on design requirements as is known in the art. In embodiments where the semiconductor device formed on the workpiece 400 is p-type, an n-type doping profile (i.e., an n-type well or n-well) may be formed on the substrate 401. In some implementations, the n-type dopant for forming the n-type well may include phosphorus (P) or arsenic (As). In embodiments where the semiconductor device formed on the workpiece 400 is n-type, a p-type doping profile (i.e., a p-type well or p-well) may be formed on the substrate 401. In some implementations, the p-type dopant for forming the p-type well may include boron (B) or gallium (Ga). The suitable doping may include ion implantation of dopants and/or diffusion processes. In some embodiments not explicitly shown in the figures, the substrate 401 may include anti-punch through (APT) implantation regions in the wells. The APT implantation regions and the underlying well regions may share the same type of dopant but the dopant concentration in the APT implantation regions are higher. Generally speaking, well regions may be formed using high energy and low doses of dopants while APT implantation regions may be formed using low energy and high doses of dopants. As a result, wells extend further into the substrate 401 while the APT implantation regions are shallower and have a high dopant concentration. While APT implantation regions also function to slow down dopant out-diffusion and reduce leakage, they are formed early in the process and tend to diffuse outward during various thermal cycles as the fabrication process progresses. Contrarily, the diffusion stop layer of the present disclosure is formed right over the source/drain regions to provide precise diffusion control and leakage reduction at the place where it is needed most. Because the diffusion stop layer of the present disclosure is formed much later in the process, it is less likely to diffuse outward like the APT implantation regions do.

The workpiece 400 further includes the epitaxial layer 402. A composition of the epitaxial layer 402 may be different from a composition of the substrate 401. In one embodiment, the substrate 401 is formed of silicon and the epitaxial layer 402 is formed of silicon germanium (SiGe). The epitaxial layer 402 is deposited on the substrate 401 using a molecular beam epitaxy (MBE) process, a vapor phase deposition (VPE) process, and/or other suitable epitaxial growth processes. Due to the compositional difference, lattices of the epitaxial layer 402 and the substrate 401 are mismatched and the epitaxial layer 402 is strained. When the substrate 401 is a silicon (Si) substrate, a germanium content of the epitaxial layer 402 may be between about 18% and about 25%. When the germanium content of the epitaxial layer 402 is lower than 18%, the epitaxial layer 402 may not provide a good environment for satisfactory formation of an overlying source/drain feature. When the germanium content of the epitaxial layer 402 is greater than 25%, the lattice mismatch between the substrate 401 and the epitaxial layer 402 may be too great such that the epitaxial layer 402 may have a high defect density, which may also impact the formation of the overlying source/drain feature.

In some embodiments, the stack 404 includes sacrificial layers 406 of a first semiconductor composition interleaved by channel layers 408 of a second semiconductor composition. It can also be said that the channel layers 408 are interleaved by the sacrificial layers 406. The first and second semiconductor composition may be different. In some embodiments, the sacrificial layers 406 include silicon germanium (SiGe) or germanium tin (GeSn) and the channel layers 408 include silicon (Si). It is noted that four (4) layers of the sacrificial layers 406 and three (3) layers of the channel layers 408 are alternately arranged as illustrated in FIG. 21, which is for illustrative purposes only and not intended to be limiting beyond what is specifically recited in the claims. It can be appreciated that any number of epitaxial layers may be formed in the stack 404. The number of layers depends on the desired number of channels members for the semiconductor device 400. In some embodiments, the number of channel layers 408 is between 2 and 10. In the embodiments represented in FIG. 21, the stack 404 includes a topmost sacrificial layer 406. In the embodiments, the topmost sacrificial layer 406 functions to protect the topmost channel layer and may be completely consumed in subsequent processes.

In some embodiments, all sacrificial layers 406 may have a substantially uniform first thickness and all of the channel layers 408 may have a substantially uniform second thickness. The first thickness and the second thickness may be identical or different. As described in more detail below, the channel layers 408 or parts thereof may serve as channel member(s) for a subsequently-formed multi-gate device and the thickness of each of the channel layers 408 is chosen based on device performance considerations. The sacrificial layers 406 in channel regions(s) may eventually be removed and serve to define a vertical distance between adjacent channel members, which are formed from the channel layers 408, for a subsequently-formed multi-gate device and the thickness of each of the sacrificial layers 406 is chosen based on device performance considerations.

The sacrificial layers 406 and channel layers 408 in the stack 404 may be deposited using a molecular beam epitaxy (MBE) process, a vapor phase deposition (VPE) process, and/or other suitable epitaxial growth processes. As stated above, in at least some examples, the sacrificial layers 406 include an epitaxially grown silicon germanium (SiGe) layer and the channel layers 408 include an epitaxially grown silicon (Si) layer. In some embodiments, the sacrificial layers 406 and the channel layers 408 are substantially dopant-free (i.e., having an extrinsic dopant concentration from about 0 atoms/cm$^3$ to about $1 \times 10^{17}$ atoms/cm$^3$), where for example, no intentional doping is performed during the epitaxial growth processes for the stack 404. In some alternative embodiments, the sacrificial layers 406 may include silicon germanium (SiGe) and the channel layers 408 include silicon (Si).

Figure 22:
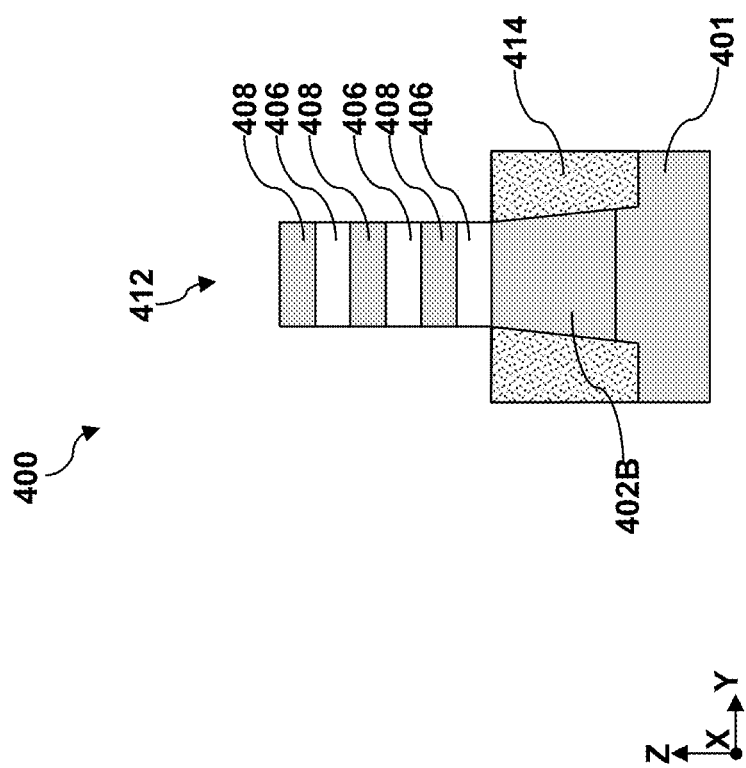

Referring still to FIGS. 20, 21 and 22, method 300 includes a block 304 where a fin-shaped structure 412 is formed from the stack 404 and the epitaxial layer 402. To pattern the stack 404, a hard mask layer 410 (shown in FIG. 21) may be deposited over the stack 404 to form an etch mask. The hard mask layer 410 may be a single layer or a multi-layer. For example, the hard mask layer 410 may include a pad oxide layer and a pad nitride layer disposed over the pad oxide layer. The fin-shaped structure 412 may be patterned from the stack 404 and the epitaxial layer 402 using a lithography process and an etch process. The lithography process may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etching (e.g., RIE etching), wet etching, and/or other etching methods. As shown in FIG. 22, the etch process at block 304 forms trenches extending vertically through the stack 404 and a portion of the epitaxial layer 402. The trenches define the fin-shaped structures 412. In some implementations, double-patterning or multi-patterning processes may be used to define fin-shaped structures that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the fin-shaped structure 412 by etching the stack 404. As shown in FIG. 22, the fin-shaped structure 412 that includes the sacrificial layers 406 and the channel layers 408 extends vertically along the Z direction and lengthwise along the X direction. As shown in FIG. 22, the fin-shaped structure 412 includes a base fin structure 402B patterned from the epitaxial layer 402. The patterned stack 404, including the sacrificial layers 406 and the channel layers 408, is disposed directly over the base fin structure 402B.

An isolation feature 414 is formed adjacent the fin-shaped structure 412. In some embodiments represented in FIG. 22, the isolation feature 414 is disposed on sidewalls of the base fin structure 402B. In some embodiments, the isolation feature 414 may be formed in the trenches to isolate the fin-shaped structures 412 from a neighboring fin-shaped structure. The isolation feature 414 may also be referred to as a shallow trench isolation (STI) feature 414. By way of example, in some embodiments, a dielectric layer is first deposited over the workpiece 400, filling the trenches with the dielectric layer. In some embodiments, the dielectric layer may include silicon oxide, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, a spin-on coating process, and/or other suitable process. The deposited dielectric material is then thinned and planarized, for example by a chemical mechanical polishing (CMP) process. The planarized dielectric layer is further recessed or pulled-back by a dry etching process, a wet etching process, and/or a combination thereof to form the STI feature 414 shown in FIG. 22. The fin-shaped structure 412 rises above the STI feature 414 after the recessing, while the base fin structure 402B is embedded or buried in the isolation feature 414.

Figure 23:
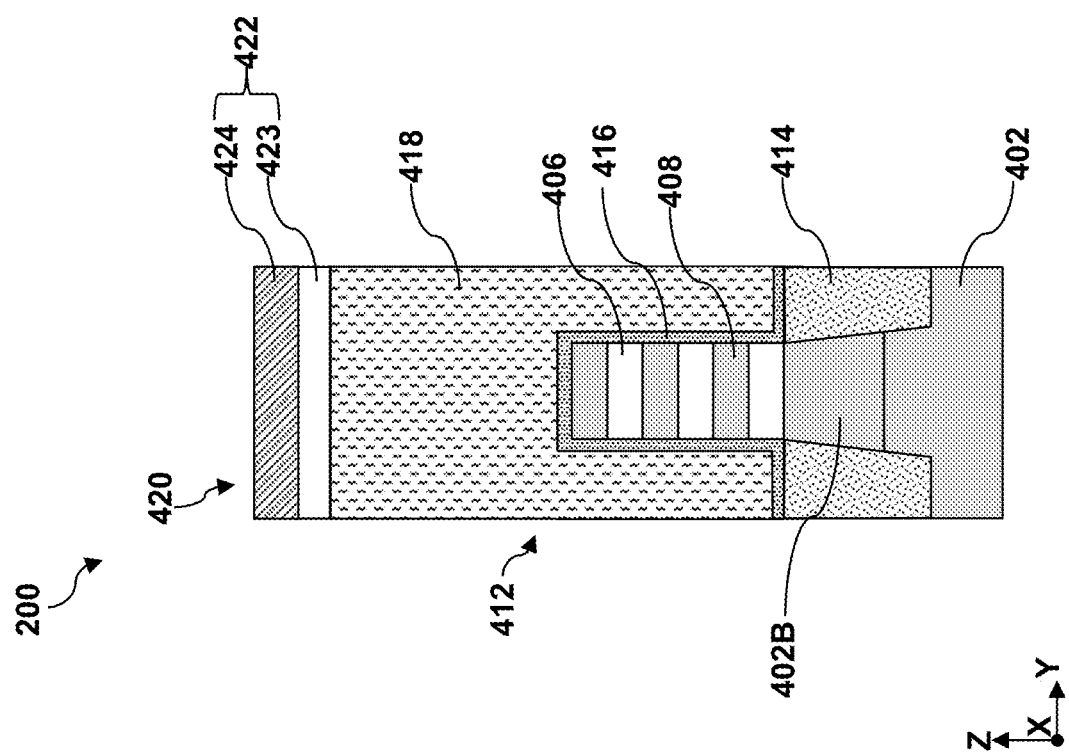
Figure 24:
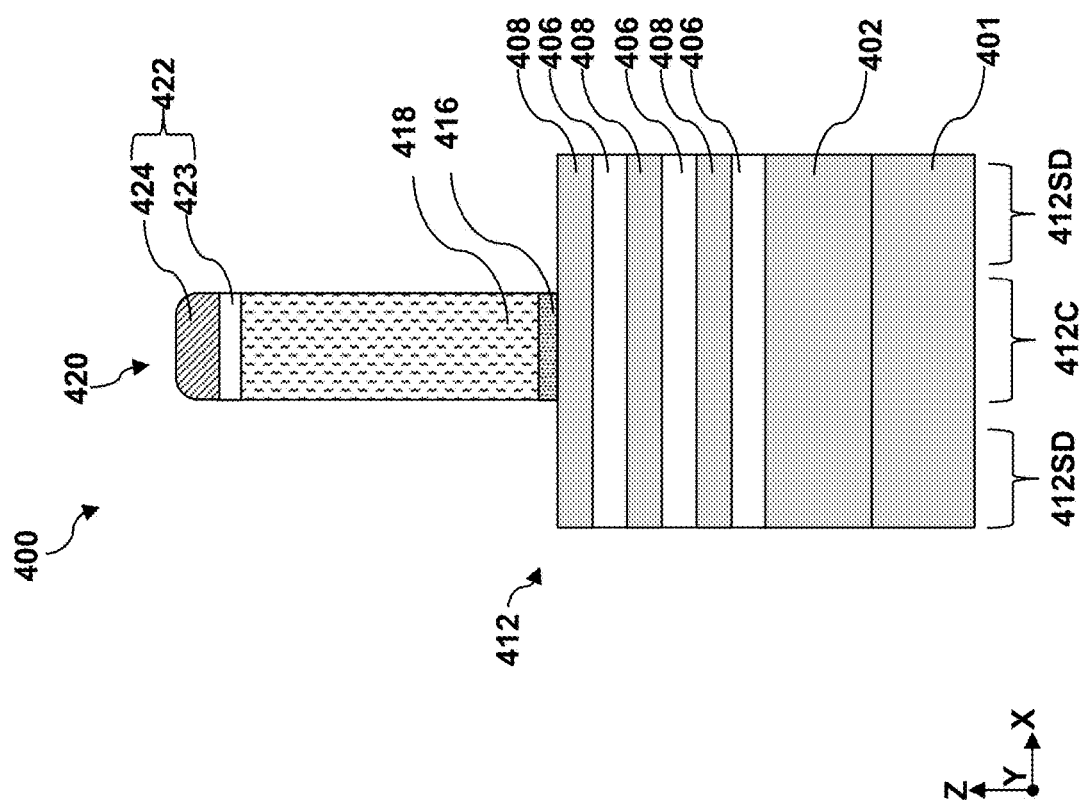

Referring to FIGS. 20, 23 and 24, method 300 includes a block 306 where a dummy gate stack 420 is formed over a channel region 412C of the fin-shaped structure 412. In some embodiments, a gate replacement process (or gate-last process) is adopted where the dummy gate stack 420 (shown in FIGS. 23 and 24) serves as a placeholder to undergo various processes and is to be removed and replaced by a functional gate structure. Other processes and configuration are possible. In some embodiments illustrated in FIG. 24, the dummy gate stack 420 is formed over the fin-shaped structure 412 and the fin-shaped structure 412 may be divided into channel regions 412C underlying the dummy gate stacks 420 and source/drain regions 412SD that do not underlie the dummy gate stacks 420. The channel regions 412C are adjacent the source/drain regions 412SD. As shown in FIG. 24, the channel region 412C is disposed between two source/drain regions 412SD along the X direction.

The formation of the dummy gate stack 420 may include deposition of layers in the dummy gate stack 420 and patterning of these layers. Referring to FIG. 23, a dummy dielectric layer 416, a dummy electrode layer 418, and a gate-top hard mask layer 422 may be blanketly deposited over the workpiece 400. In some embodiments, the dummy dielectric layer 416 may be formed on the fin-shaped structure 412 using a chemical vapor deposition (CVD) process, an ALD process, an oxygen plasma oxidation process, or other suitable processes. In some instances, the dummy dielectric layer 416 may include silicon oxide. Thereafter, the dummy electrode layer 418 may be deposited over the dummy dielectric layer 416 using a CVD process, an ALD process, or other suitable processes. In some instances, the dummy electrode layer 418 may include polysilicon. For patterning purposes, the gate-top hard mask layer 422 may be deposited on the dummy electrode layer 418 using a CVD process, an ALD process, or other suitable processes. The gate-top hard mask layer 422, the dummy electrode layer 418 and the dummy dielectric layer 416 may then be patterned to form the dummy gate stack 420, as shown in FIG. 24. For example, the patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the gate-top hard mask layer 422 may include a silicon oxide layer 423 and a silicon nitride layer 424 over the silicon oxide layer 423. As shown in FIG. 24, the dummy gate stack 420 is patterned such that it is only disposed over the channel region 412C, not disposed over the source/drain region 412SD.

Figure 25:
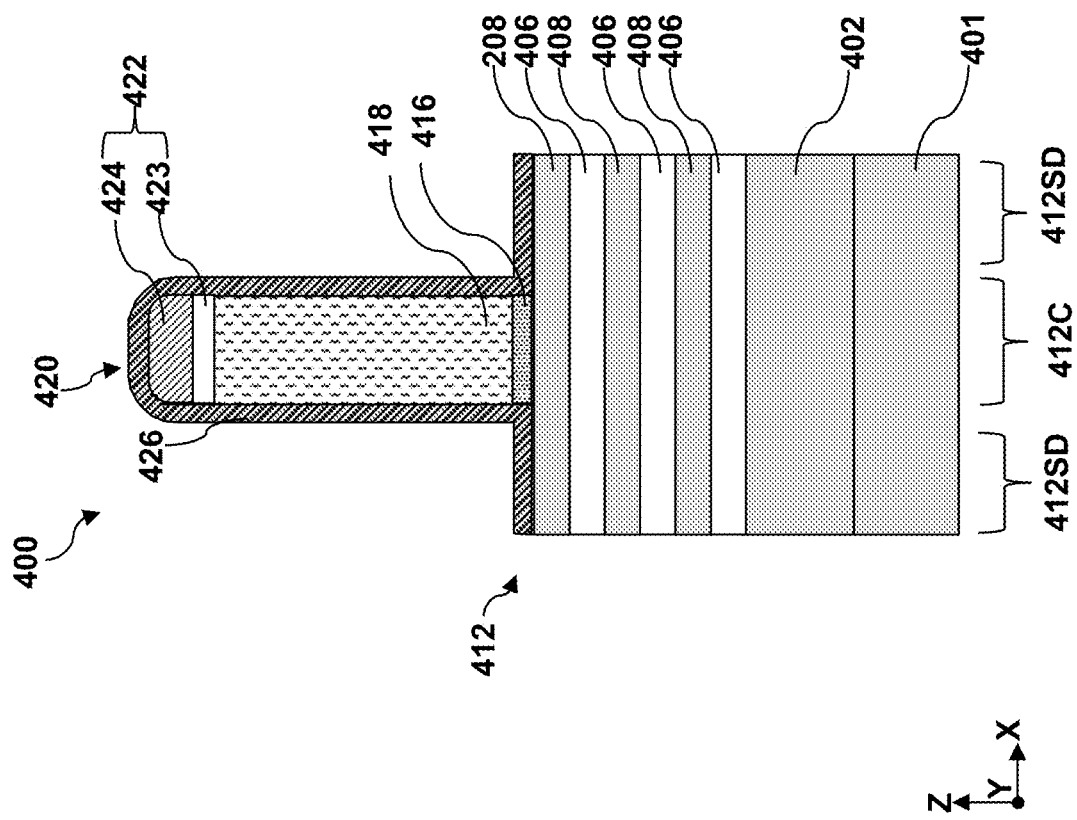

Referring to FIGS. 20 and 25, method 300 includes a block 308 where a gate spacer layer 426 is deposited over the workpiece 400, including over the dummy gate stack 420. In some embodiments, the gate spacer layer 426 is deposited conformally over the workpiece 400, including over top surfaces and sidewalls of the dummy gate stack 420. The term "conformally" may be used herein for ease of description of a layer having substantially uniform thickness over various regions. The gate spacer layer 426 may be a single layer or a multi-layer. The at least one layer in the gate spacer layer 426 may include silicon carbonitride, silicon oxycarbide, silicon oxycarbonitride, or silicon nitride. The gate spacer layer 426 may be deposited over the dummy gate stack 420 using processes such as, a CVD process, a subatmospheric CVD (SACVD) process, an ALD process, or other suitable process.

Figure 26:
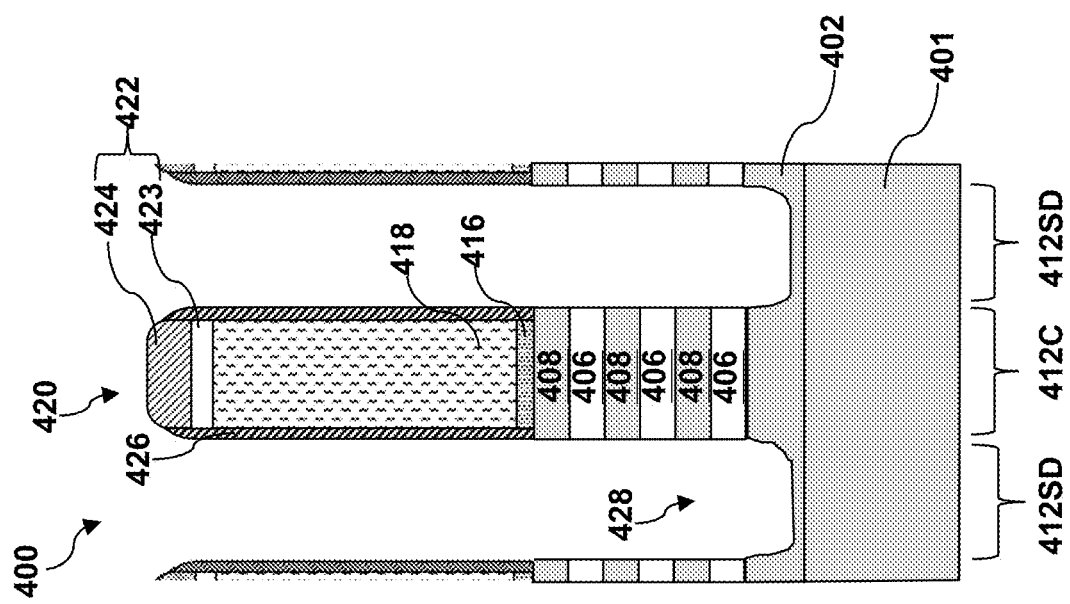

Referring to FIGS. 20 and 26, method 300 includes a block 310 where a source/drain region 412SD of the fin-shaped structure 412 is anisotropically recessed to form a source/drain trench 428. The anisotropic etch may include a dry etch or a suitable etch process that etches the source/drain regions 412SD and a portion of the epitaxial layer 402 below the source/drain regions 412SD. The resulting source/drain trench 428 extends vertically through the depth of the stack 404 and partially into the epitaxial layer 402. In some embodiments represented in FIG. 26, the resulting source/drain trench 428 extends vertically into the epitaxial layer 402, but does not extend into the substrate 401. The non-exposure of the substrate 401 prevents bare silicon (Si) surface of the substrate 401 from being a growth surface of any overlying silicon germanium (SiGe) epitaxial layers. However, in some alternative embodiments shown in FIG. 35, the source/drain trench 428 is allowed to extend into the substrate 401. In those alternative embodiments, a diffusion stop layer is formed to a greater thickness to ensure satisfactory device performance. An example dry etch process for block 310 may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/ or plasmas, and/or combinations thereof. As illustrated in FIG. 26, the source/drain regions 412SD of the fin-shaped structure 412 are recessed to expose sidewalls of the sacrificial layers 406 and the channel layers 408. Because the source/drain trenches 428 extend below the stack 404 into the epitaxial layer 402, the source/drain trenches 428 include bottom surfaces and lower sidewalls defined in the epitaxial layer 402.

Figure 27:
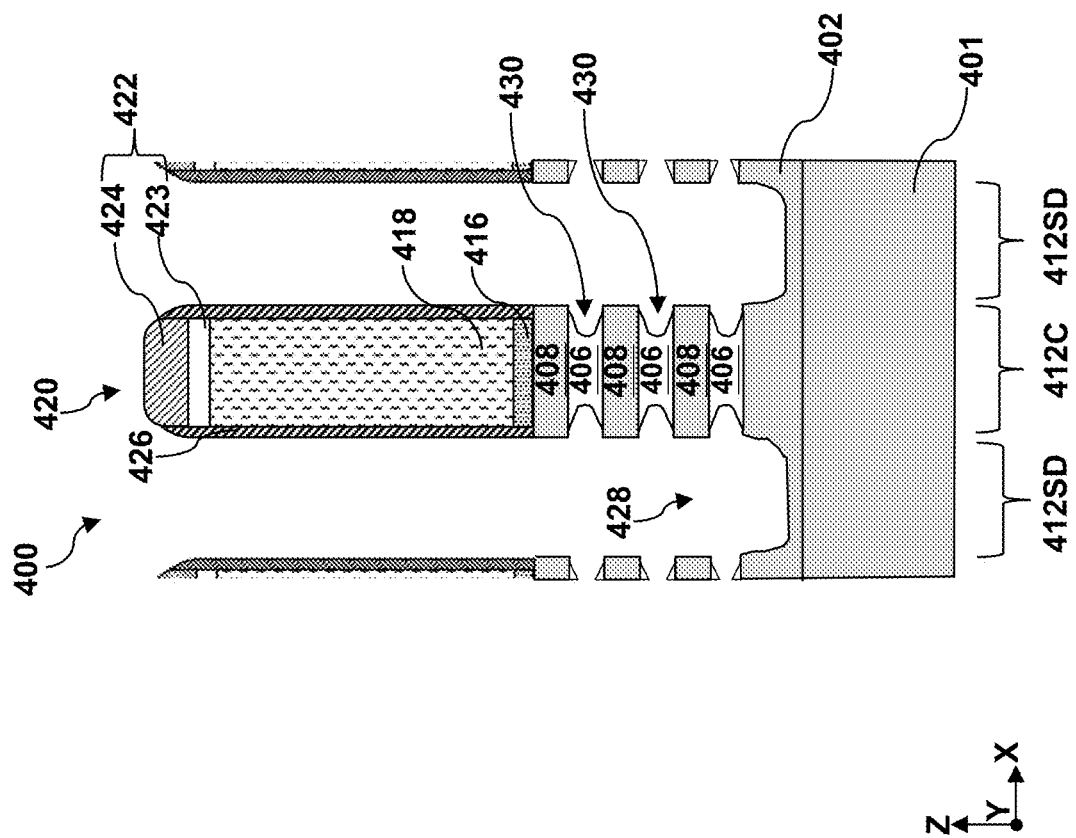
Figure 28:
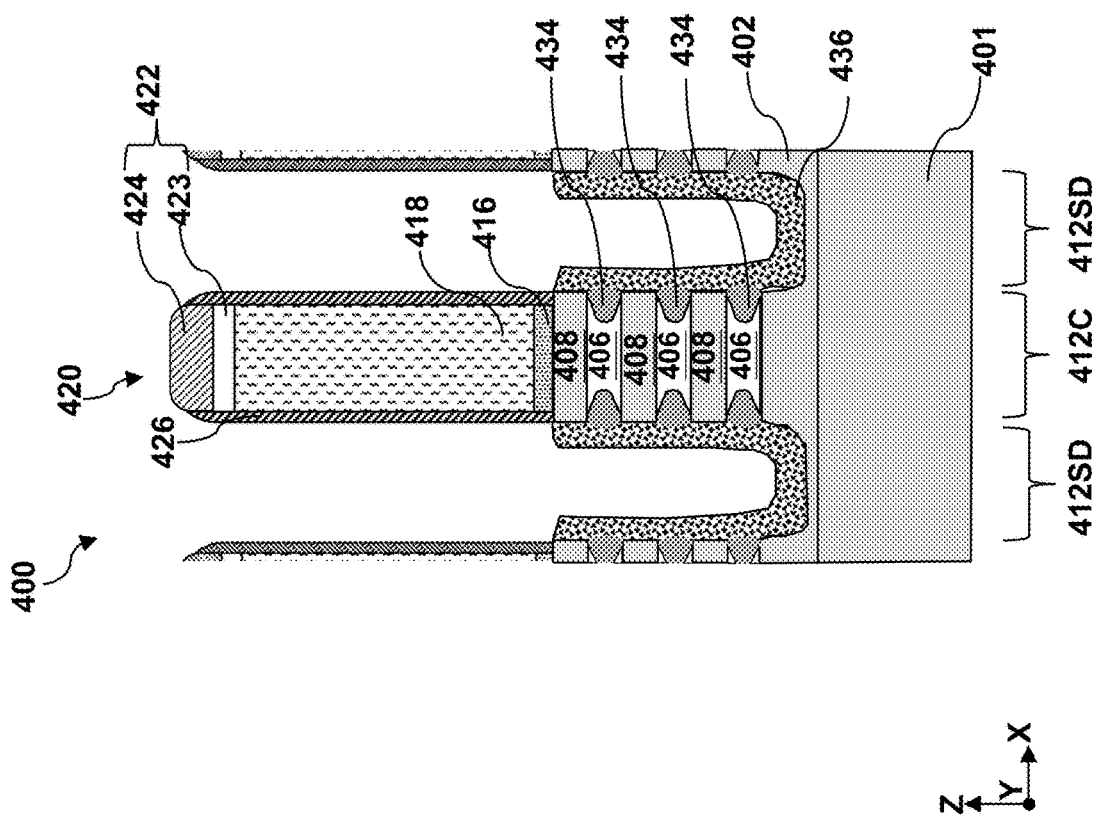

Referring to FIGS. 20, 27 and 28, method 300 includes a block 312 where inner spacer features 434 are formed. Although not completely shown in the figures, operation at block 312 may include selective and partial removal of the sacrificial layers 406 to form inner spacer recesses 430 (shown in FIG. 27), deposition of inner spacer material over the workpiece 400, and etch back the inner spacer material to form inner spacer features 434 in the inner spacer recesses 430 (shown in FIG. 28). Referring to FIG. 27, the sacrificial layers 406 exposed in the source/drain trenches 428 are selectively and partially recessed to form inner spacer recesses 430 while the gate spacer layer 426, the exposed portion of the epitaxial layer 402, and the channel layers 408 are substantially unetched. In an embodiment where the channel layers 408 consist essentially of silicon (Si) and sacrificial layers 406 consist essentially of silicon germanium (SiGe), the selective recess of the sacrificial layers 406 may be performed using a selective wet etch process or a selective dry etch process. An example selective dry etching process may include use of one or more fluorine-based etchants, such as fluorine gas or hydrofluorocarbons. An example selective wet etching process may include an APM etch (e.g., ammonia hydroxide-hydrogen peroxide-water mixture).

After the inner spacer recesses 430 are formed, an inner spacer material is deposited over the workpiece 400, including over the inner spacer recesses 430. The inner spacer material may include metal oxides, silicon oxide, silicon oxycarbonitride, silicon nitride, silicon oxynitride, carbon-rich silicon carbonitride, or a low-k dielectric material. The metal oxides may include aluminum oxide, zirconium oxide, tantalum oxide, yttrium oxide, titanium oxide, lanthanum oxide, or other suitable metal oxide. While not explicitly shown, the inner spacer material may be a single layer or a multilayer. In some implementations, the inner spacer material may be deposited using CVD, PECVD, SACVD, ALD or other suitable methods. The inner spacer material is deposited into the inner spacer recesses 430 as well as over the sidewalls of the channel layers 408 exposed in the source/drain trenches 428. Referring to FIG. 28, the deposited inner spacer material is then etched back to remove the inner spacer material from the sidewalls of the channel layers 408 to form the inner spacer features 434 in the inner spacer recesses 430. At block 312, the inner spacer material may also be removed from the top surfaces and/or sidewalls of the gate-top hard mask layer 422 and the gate spacer layer 426. In some implementations, the etch back operations performed at block 312 may include use of hydrogen fluoride (HF), fluorine gas ($F_2$), hydrogen ($H_2$), ammonia ($NH_3$), nitrogen trifluoride ($NF_3$), or other fluorine-based etchants. As shown in FIG. 28, each of the inner spacer features 434 is in direct contact with the recessed sacrificial layers 406 and is disposed vertically (along the Z direction) between two neighboring channel layers 408. After the inner spacer features 434 are formed, a wet etch or a cleaning process may be performed to remove debris, oxides, or fluorides from the surfaces of the channel layers 408 and the epitaxial layer 402. This cleaning process ensures satisfactory epitaxial deposition of subsequent layers.

Figure 29:
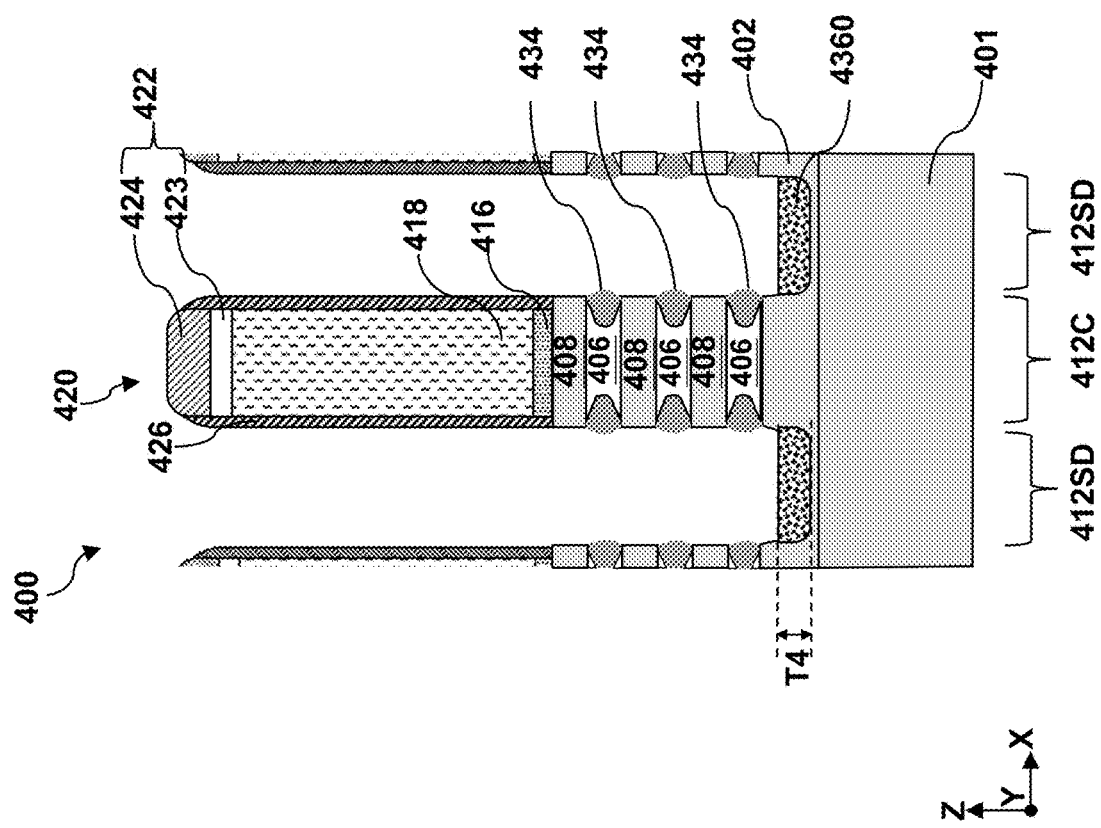

Referring to FIGS. 20, 28 and 29, method 300 includes a block 314 where a diffusion stop layer 4360 is formed on a bottom surface of the source/drain trench 428. Operations at block 314 may include deposition of a semiconductor layer 436 over the source/drain trench 428 (shown in FIG. 28) and selective etch back of the deposited semiconductor layer 436 to form the diffusion stop layer 4360 (shown in FIG. 29). Referring to FIG. 28, the semiconductor layer 436 is deposited over the source/drain trench 428 in a conformal manner. The manner of deposition of the semiconductor layer 436 may be controlled by process temperature and supply of the precursors. When conformal deposition of the semiconductor layer 436 is desired, the deposition is configured such that the deposition along the [001] or [110] crystalline direction are substantially the same. In the embodiments illustrated in FIG. 28, the [001] crystalline direction is along the Z direction and the [110] crystalline direction is along the X direction.

In some embodiments, both the diffusion stop layer 4360 and the epitaxial layer 402 may include silicon germanium (SiGe), where a germanium content of the diffusion stop layer 4360 is greater than a germanium content of the epitaxial layer 402. In some instances, the germanium content in the diffusion stop layer 4360 may be between about 25% and about 35% while the germanium content in the epitaxial layer 402 may be between about 18% and about 25%. As will be described in further detail below, the germanium content of the diffusion stop layer 4360 is greater than a germanium content of a first epitaxial layer in the source/drain feature overlying the diffusion stop layer 4360. The semiconductor layer 436 may be deposited using vapor-phase epitaxy (VPE), ultra-high vacuum CVD (UHV-CVD), molecular beam epitaxy (MBE), and/or other suitable processes. In some instances, deposition of the semiconductor layer 436 may include use of silane, silane dichloride, germane, isobutyl germane, alkylgermanium trichloride, dimethylaminogermanium trichloride, or other silicon or germanium-containing precursors. The deposited semiconductor layer 436 comes in direct contact with the inner spacer features 434, sidewalls of the channel layers 408, sidewalls of the epitaxial layer 402, and a top surface of the epitaxial layer 402 in the source/drain trench 428. In some embodiments where the MBC transistor is a p-type device and the diffusion stop layer 4360 is configured to slow down out-diffusion of boron (B) from overlying source/drain structures, the semiconductor layer 436 may be in-situ doped with phosphorus (P) or carbon (C). Here, because boron (B) is a p-type dopant and phosphorus (P) or carbon (C) is an n-type dopant, doping of phosphorus (P) or carbon (C) may be referred to as anti-doping. In these embodiments, the anti-doping concentration of phosphorus (P) or carbon (C) is between $5 \times 10^{18}$ atoms/$cm^3$ and about $5 \times 10^{20}$ atoms/$cm^3$. When the anti-doping concentration of phosphorus (P) or carbon (C) is smaller than $5 \times 10^{18}$ atoms/$cm^3$, the diffusion stop property of the diffusion stop layer 4360 may be similar to that of one without any intentional doping. That is, if the anti-doping concentration is smaller than $5 \times 10^{18}$ atoms/$cm^3$, the anti-doping concentration would be so insignificant that one might as well implement an undoped semiconductor layer 436 instead and omit all the in-situ doping steps. When the anti-doping concentration of phosphorus (P) or carbon (C) is greater than $5 \times 10^{20}$ atoms/$cm^3$, the anti-doping concentration may lead to defects in epitaxial layers formed on the diffusion stop layer 4360, impacting the performance of the resulting device.

It is noted while a p-type MBC transistor is illustrated in the drawings, embodiments of the present disclosure may be implemented in an n-type MBC transistor. Because the diffusion stop layer 4360 is formed of silicon germanium (SiGe), the larger-than-silicon germanium atoms may function to slow down out-diffusion of n-type dopants, such as phosphorus (P) or arsenic (As), in n-type source/drain features. Additionally, silicon germanium (SiGe) in the diffusion stop layer 4360 may operate to provide tensile stress to improve carrier mobility in channels of the n-type multi-gate device. When the diffusion stop layer 4360 is implemented in an n-type multi-gate device, the diffusion stop layer 4360 may be in-situ doped with carbon (C) to further slow down the out-diffusion of phosphorus (P). When the diffusion stop layer 4360 is doped with carbon (C), the diffusion stop layer 4360 is formed of SiGe:C. When doped with carbon (C), a carbon doping concentration in the diffusion stop layer 4360 may be between $5 \times 10^{18}$ atoms/cm$^3$ and about $5 \times 10^{20}$ atoms/cm$^3$.

As will be described further below, the source/drain feature overlying the diffusion stop layer 4360 is doped with a p-type dopant, such as boron (B). While the diffusion stop layer 4360 may slow down the out-diffusion of boron (B) from the overlying source/drain feature, some boron (B) may diffuse in the diffusion stop layer 4360. In some embodiments, besides phosphorus (P) and/or carbon (C), the diffusion stop layer 4360 may include boron (B) in the final structure. In some instances, a boron doping concentration in the diffusion stop layer 4360 may be smaller than $2 \times 10^{20}$ atoms/cm$^3$, such as between about $1 \times 10^{18}$ atoms/cm$^3$ and about $2 \times 10^{20}$ atoms/cm$^3$. While not explicitly shown, when the diffusion stop layer 4360 is implemented in an n-type MBC transistor, some phosphorus (P) may diffuse into the diffusion stop layer 4360. As a result, a diffusion stop layer 4360 in an n-type MBC transistor may include phosphorus (P) at a concentration smaller than about $1 \times 10^{20}$ atoms/cm$^3$, such as between about $1 \times 10^{18}$ atoms/cm$^3$ and about $1 \times 10^{20}$ atoms/cm$^3$.

After the semiconductor layer 436 is deposited as shown in FIG. 28, the semiconductor layer 436 is etched back to form the diffusion stop layer 4360 as shown in FIG. 29. The etch back at block 314 may be regarded as selective or directional because it is configured to etch the semiconductor layer 436 faster along the [110] crystalline direction than along the [100] direction. As deposited, the semiconductor layer 436 has a [100] crystalline direction (or [001] direction) along the Z direction and a [110] crystalline direction along the X direction or the Y direction. That is, the etch back is configured to laterally etch away the semiconductor layer 436 disposed on sidewalls of the inner spacer features 434 and the channel layers 408 but etch the semiconductor layer 436 on the bottom surface of the source/drain trench 428 at a slower rate. This uneven etch may be referred to as a lateral etch bias. In some instances, a ratio of the etch rate along the [110] direction to the etch rate along the direction may be between about 2 and about 20. The lateral etch bias explains how the semiconductor layer 436 is patterned in the selective etch back to form the diffusion stop layer 4360 shown in FIG. 29. Due to lateral etch bias, substantially all of the semiconductor layer 436 on the sidewalls of the inner spacer features 434 and the channel layers 408 is removed and a portion of the semiconductor layer 436 on the bottom surface of the source/drain trench 428 is left behind to form the diffusion stop layer 4360. Depending on the lateral bias of the etch back process, the diffusion stop layer 4360 may have a shallow dish profile or a bowl-shape profile. In any case, the etch back is aimed to remove all or substantially all of the semiconductor layer 436 along sidewalls of the source/drain trench 428.

In some instances, after the etch back, the diffusion stop layer 4360 may have a fourth thickness T4 between about 0.5 nm and about 20 nm. This thickness range is critical. When the fourth thickness T4 of the diffusion stop layer 4360 is smaller than 0.5 nm, the diffusion stop layer 4360 may not have sufficient thickness to slow down the out-diffusion of boron (B). Additionally, as will be described below, when the fourth thickness T4 of the diffusion stop layer 4360 is smaller than 0.5 nm, two adjacent source/drain features may not have a sufficiently high merge height to result in reduction of parasitic capacitance. When the fourth thickness T4 of the diffusion stop layer 4360 is greater than 20 nm, the diffusion stop layer 4360 may necessitate a deep source/drain trench 428 to accommodate the source/drain feature. There are challenges associated with forming deep source/drain trench 428. First, a deep source/drain trench 428 may extend into and expose a portion of the substrate 401, which may be formed of silicon (Si), instead of silicon germanium (SiGe). Because the semiconductor layer 436 and overlying epitaxial layers are all formed of silicon germanium (SiGe), a bare silicon surface may lead to undesirably high crystalline defects. Second, there is a limit as to the thickness of the epitaxial layer 402. Because the lattice mismatch between silicon (Si) in the substrate 401 and silicon germanium (SiGe) in the epitaxial layer 402 increases with the thickness of the epitaxial layer 402, when the epitaxial layer 402 reaches a thickness between about 60 nm and about 70 nm, the quality of the epitaxial layer 402 can no longer be maintained and the defect density in the epitaxial layer 402 may be too high. Third, it is difficult to form a high-aspect-ratio source/drain trench with good control of bottom profile. For at least these three reasons, the thickness of the diffusion stop layer 4360 should be smaller than 20 nm in some embodiments to avoid an overly deep source/drain trench 428 or inferior crystalline quality of the epitaxial layer 402. In some alternative embodiments to be described further below, the source/drain trench 428 may be allowed to extend into the substrate 401 and a thicker diffusion stop layer 4360 is deposited over the exposed portion of the substrate 401. In those alternative embodiments, the thicker diffusion stop layer 4360 serves at least two purposes. First, it allows the lattice mismatch between silicon (Si) and silicon germanium (SiGe) to dissipate and provides a defect-less surface for further deposition of various epitaxial layers in the source/drain features. Second, its thickness allows it to better cover the exposed portion of the substrate 401 to prevent dopant out-diffusion and leakage.

The etch back at block 314 may include etchant gas species such as hydrogen chloride (HCl), chlorine (Cl$_2$), hydrogen bromide (HBr), hydrogen fluoride (HF), nitrogen trifluoride (NF$_3$), amine, carbon fluoride, sulfur fluoride, argon, or carbonyl sulfide (COS). The etch back may also include use of one or more carrier gas, such as hydrogen (H$_2$), nitrogen (N$_2$), oxygen (O$_2$), or helium (He). In one embodiment, the etchant gas is hydrogen chloride and the carrier gas is hydrogen. To achieve the desired lateral etch bias described above, the etch back process at block 314 include a high process temperature and low process pressure. In some embodiments, the high process temperature may be between about 500° C. and about 800° C. and the low process pressure may be between about 5 torr and about 350 torr. In one embodiment, the etch back process at block 314 includes use of hydrogen chloride (HCl) at a flow rate between about 30 standard cubic centimeters per minute (SCCM) and 3000 SCCM.

Figure 30:
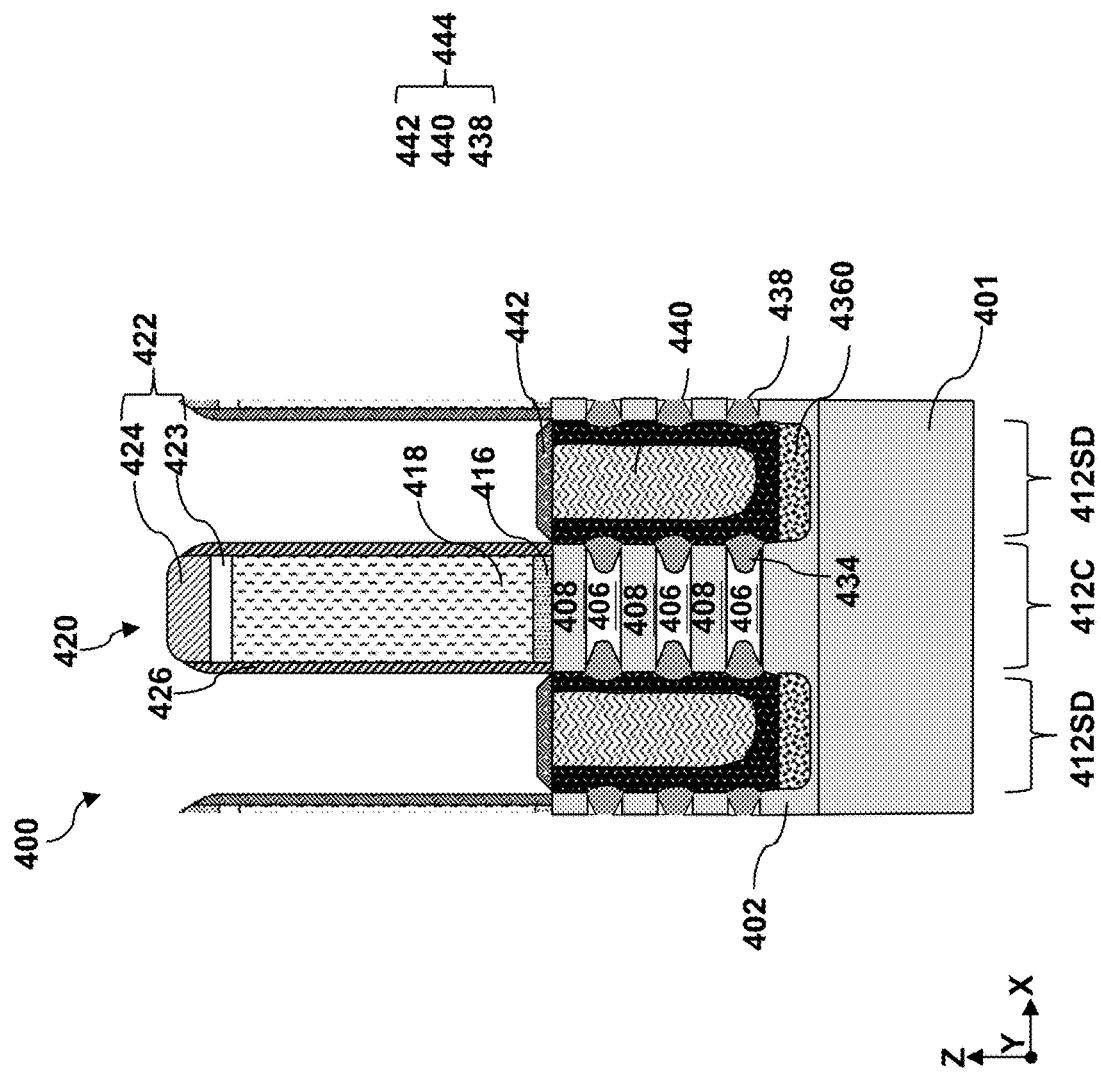

Referring to FIGS. 20 and 30, method 300 includes a block 316 where a first epitaxial layer 438 is selectively deposited over a top surface of the diffusion stop layer 4360 and exposed sidewalls of the channel layers 408 and inner spacer features 434. In some embodiments, the first epitaxial layer 438 may be deposited using vapor-phase epitaxy (VPE), ultra-high vacuum CVD (UHV-CVD), molecular beam epitaxy (MBE), and/or other suitable processes. In some embodiments, the first epitaxial layer 438 may include silicon germanium (SiGe) and may be deposited using precursors such as silane, silane dichloride, germane, isobutyl germane, alkylgermanium trichloride, dimethylaminogermanium trichloride, or other silicon or germanium-containing precursors. The first epitaxial layer 438 may be in-situ doped with a p-type dopant, such as boron (B). In some embodiments, the first epitaxial layer 438 may include a boron doping concentration between about $2 \times 10^{20}$ atoms/cm$^3$ and about $1 \times 10^{21}$ atoms/cm$^3$. In order for the diffusion stop layer 4360 to function as a dopant blocker, a germanium content in the first epitaxial layer 438 is smaller than the germanium content in the diffusion stop layer 4360. In some embodiments, the germanium content in the diffusion stop layer 4360 is between about 25% and 35% while the germanium content in the first epitaxial layer 438 is between about 20% and 30%. In some embodiments, the germanium content in the first epitaxial layer 438 gradually increases from the interface between the diffusion stop layer 4360 and the first epitaxial layer 438. At least at that interface, a germanium content difference between the diffusion stop layer 4360 and the first epitaxial layer 438 is greater than 5%, such as between about 5% and 10%. Along the vertical direction (Z direction), the diffusion stop layer 4360 is disposed directly between the underlying epitaxial layer 402 and the overlying first epitaxial layer 438. Because the germanium content of the diffusion stop layer 4360 is greater than that in the epitaxial layer 402 or the first epitaxial layer 438, the diffusion stop layer 4360 creates a local germanium content spike between the epitaxial layer 402 and the first epitaxial layer 438. Experimental result show that this local germanium content spike helps slow down the diffusion of dopants like boron (B) into the epitaxial layer 402 or the substrate 401.

Referring to FIGS. 20 and 30, method 300 includes a block 318 where a second epitaxial layer 440 is deposited over surfaces of the first epitaxial layer 438. As shown in FIG. 30, because the first epitaxial layer 438 is in direct contact with the diffusion stop layer 4360 and the sidewalls of the channel layers 408 and the inner spacer features 434 while the second epitaxial layer 440 is spaced apart therefrom, the first epitaxial layer 438 may also be referred to as an outer layer 438 or an outer epitaxial layer 438 and the second epitaxial layer 440 may also be referred to as an inner layer 440 or an inner epitaxial layer 440. In some embodiments, the second epitaxial layer 440 may be deposited using vapor-phase epitaxy (VPE), ultra-high vacuum CVD (UHV-CVD), molecular beam epitaxy (MBE), and/or other suitable processes. The second epitaxial layer 440 may include silicon germanium (SiGe) and may be deposited using precursors such as silane, silane dichloride, germane, isobutyl germane, alkylgermanium trichloride, dimethylaminogermanium trichloride, or other silicon or germanium-containing precursors. Different from the first epitaxial layer 438, the second epitaxial layer 440 is a heavily doped semiconductor layer to reduce parasitic resistance. When a p-type FinFET is intended, the second epitaxial layer 440 may be doped with boron (B) with a dopant concentration between about $5 \times 10^{20}$ and about $1.5 \times 10^{21}$ atoms/cm$^3$. A germanium content of the second epitaxial layer 440 is greater than the germanium content of the diffusion stop layer 4360. In some embodiments, the germanium content of the second epitaxial layer 440 is between about 32% and about 55%. The high germanium content in the second epitaxial layer 440 functions to strain the channel region for improved carrier mobility.

Referring to FIGS. 20 and 30, method 300 includes a block 320 where a third epitaxial layer 442 is deposited over top surfaces of the second epitaxial layer 440. In some embodiments, the third epitaxial layer 442 may be deposited using vapor-phase epitaxy (VPE), ultra-high vacuum CVD (UHV-CVD), molecular beam epitaxy (MBE), and/or other suitable processes. The third epitaxial layer 442 may include silicon germanium (SiGe) and may be deposited using precursors such as silane, silane dichloride, germane, isobutyl germane, alkylgermanium trichloride, dimethylaminogermanium trichloride, or other silicon or germanium-containing precursors. The third epitaxial layer 442 serves as a capping epitaxial layer to prevent dopant in the second epitaxial layer 440 from diffusing into adjacent structures before source/drain contacts are formed. To properly serve as a capping epitaxial layer, the third epitaxial layer 442 may be doped with boron (B), albeit at a dopant concentration smaller than that in the second epitaxial layer 440. In some instances, the third epitaxial layer 442 may have a dopant concentration between about $1 \times 10^{20}$ and about $4.5 \times 10^{20}$ atoms/cm$^3$.

Referring to FIG. 30, the first epitaxial layer 438, the second epitaxial layer 440 and the third epitaxial layer 442 over the diffusion stop layer 4360 may be collectively referred to as a source/drain feature 444. The source/drain feature 444 interfaces sidewalls of the channel layers 408 in the channel region 412C, sidewalls of the inner spacer features 434, and a top surface of the diffusion stop layer 4360 by way of the first epitaxial layer 438. The second epitaxial layer 440 is spaced apart from sidewalls of the channel layers 408 in the channel region 412C, sidewalls of the inner spacer features 434, and a top surface of the diffusion stop layer 4360 by the first epitaxial layer 438.

Figure 31:
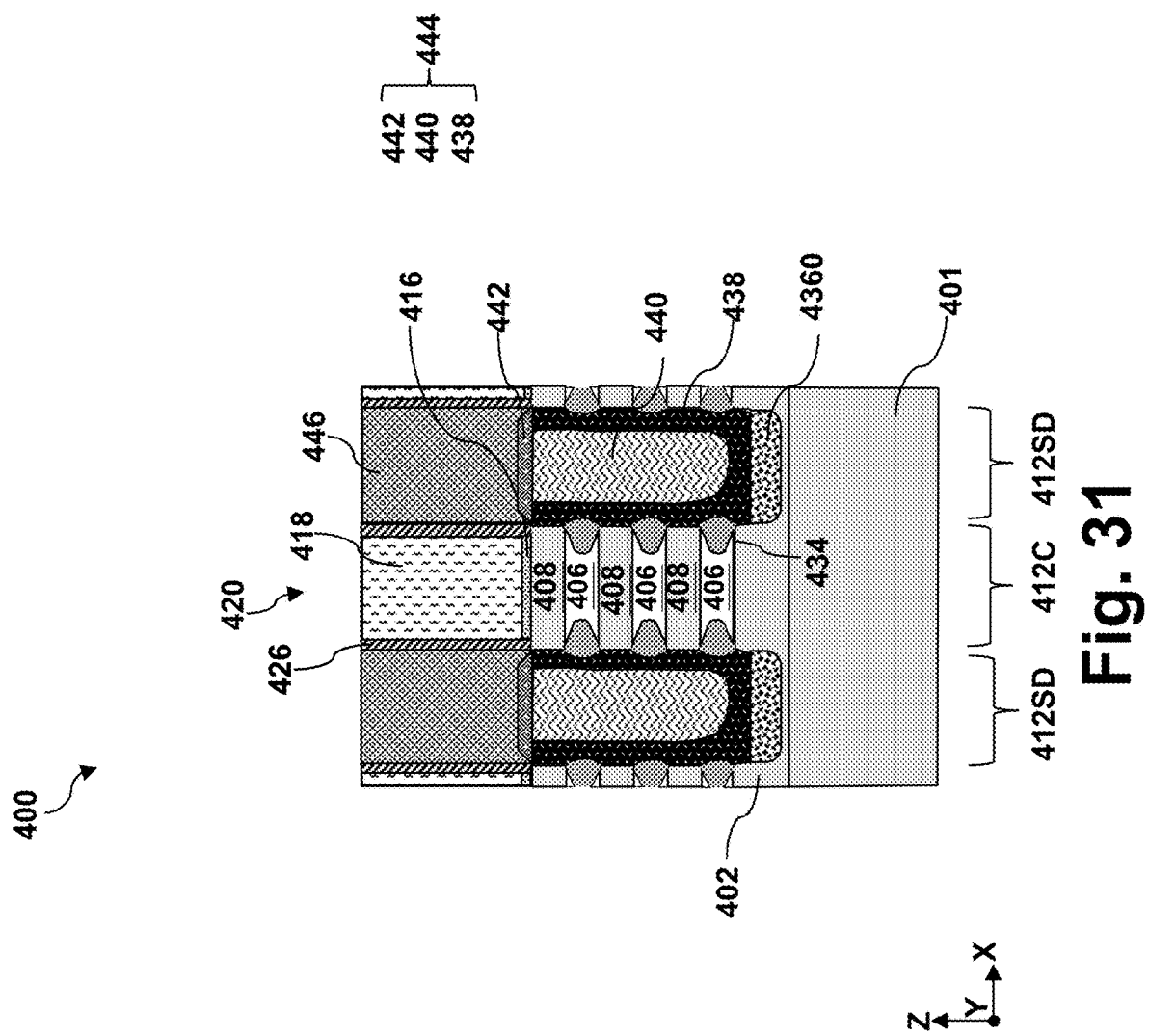

Referring to FIGS. 20 and 31-33, method 300 includes a block 322 where the dummy gate stack 420 is replaced with a gate structure 450. Block 322 may include deposition of an interlayer dielectric (ILD) layer 446 over the third epitaxial layer 442 (shown in FIG. 31), removal of the dummy gate stack 420 (shown in FIG. 32), selective removal of the sacrificial layers 406 in the channel region 412C to release the channel layers 408 as channel members 4080 (shown in FIG. 32), and formation of the gate structure 450 to wrap around each of the channel members 4080 (shown in FIG. 33). Referring to FIG. 31, the ILD layer 446 is deposited over the workpiece 400, including over the third epitaxial layer 442. In some embodiments, the ILD layer 446 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 446 may be deposited using CVD, FCVD, spin-on coating, or a suitable deposition technique. In some alternative embodiments not explicitly shown in FIG. 31, a contact etch stop layer (CESL) may be deposited over the third epitaxial layer 442 before the deposition of the ILD layer 446. The CESL may include silicon nitride. After the deposition of the ILD layer 446, the workpiece 400 may be planarized by a planarization process to expose the dummy gate stack 420. For example, the planarization process may include a chemical mechanical planarization (CMP) process. Exposure of the dummy gate stack 420 allows the removal of the dummy gate stack 420.

Figure 32:
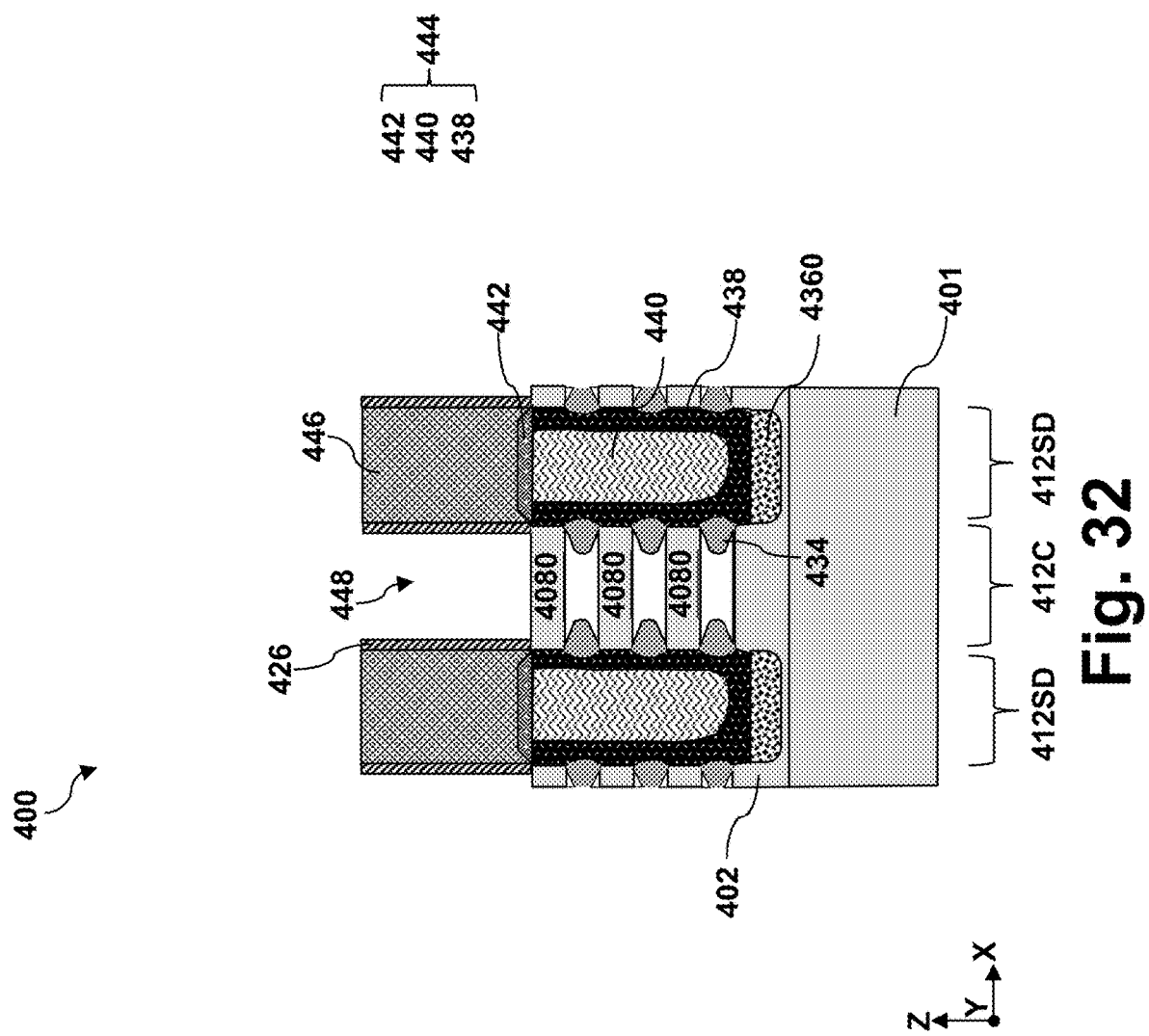

Referring to FIG. 32, the dummy gate stack 420 is removed. The removal of the dummy gate stack 420 may include one or more etching processes that are selective to the material of the dummy gate stack 420. For example, the removal of the dummy gate stack 420 may be performed using a selective wet etch, a selective dry etch, or a combination thereof that is selective to the dummy gate stack 420. After the removal of the dummy gate stack 420, sidewalls of the channel layers 408 and the sacrificial layers 406 in the channel region 412C are exposed. Referring still to FIG. 32, after the removal of the dummy gate stack 420, the sacrificial layers 406 between the channel layers 408 in the channel region 412C are selectively removed. The selective removal of the sacrificial layers 406 releases the channel layers 408 (shown in FIG. 31) to form channel members 4080 shown in FIG. 32. The selective removal of the sacrificial layers 406 forms a gate trench 448 that includes spaces between adjacent channel members 4080. The selective removal of the sacrificial layers 406 may be implemented by selective dry etch, selective wet etch, or other selective etch processes. An example selective dry etching process may include use of one or more fluorine-based etchants, such as fluorine gas or hydrofluorocarbons. An example selective wet etching process may include an APM etch (e.g., ammonia hydroxide-hydrogen peroxide-water mixture).

Figure 33:
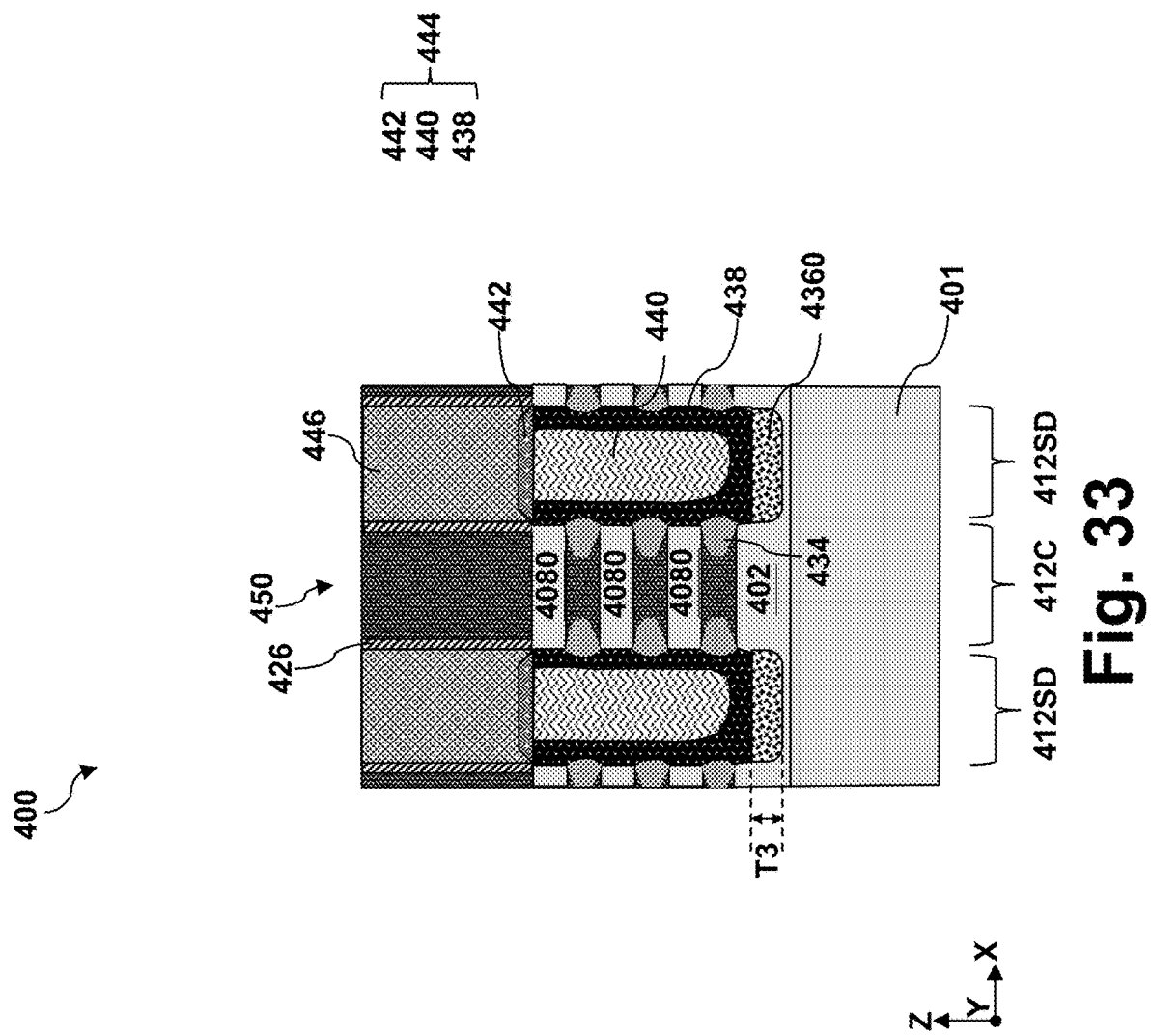

Referring to FIG. 33, after the release of the channel members 4080, the gate structure 450 is formed to wrap around each of the channel members 4080. While not explicitly shown, the gate structure 450 includes an interfacial layer interfacing the channel members 4080 and the epitaxial layer 402 in the channel region 412C, a gate dielectric layer over the interfacial layer, and a gate electrode layer over the gate dielectric layer. The interfacial layer may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The gate dielectric layer may include a high-k dielectric material, such as hafnium oxide. Alternatively, the gate dielectric layer may include other high-K dielectric materials, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HMO), hafnium titanium oxide (HfTiO), $(Ba,Sr)TiO_3$ (BST), silicon nitride (SiN), silicon oxynitride (SiON), combinations thereof, or other suitable material. The gate dielectric layer may be formed by ALD, physical vapor deposition (PVD), CVD, oxidation, and/or other suitable methods.

The gate electrode layer of the gate structure 450 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. In various embodiments, the gate electrode layer may be formed by ALD, PVD, CVD, e-beam evaporation, or other suitable process. In various embodiments, a CMP process may be performed to remove excessive metal, thereby providing a substantially planar top surface of the gate structure. The gate structure includes portions that interpose between channel members 4080 in the channel region 412C.

Figure 34:
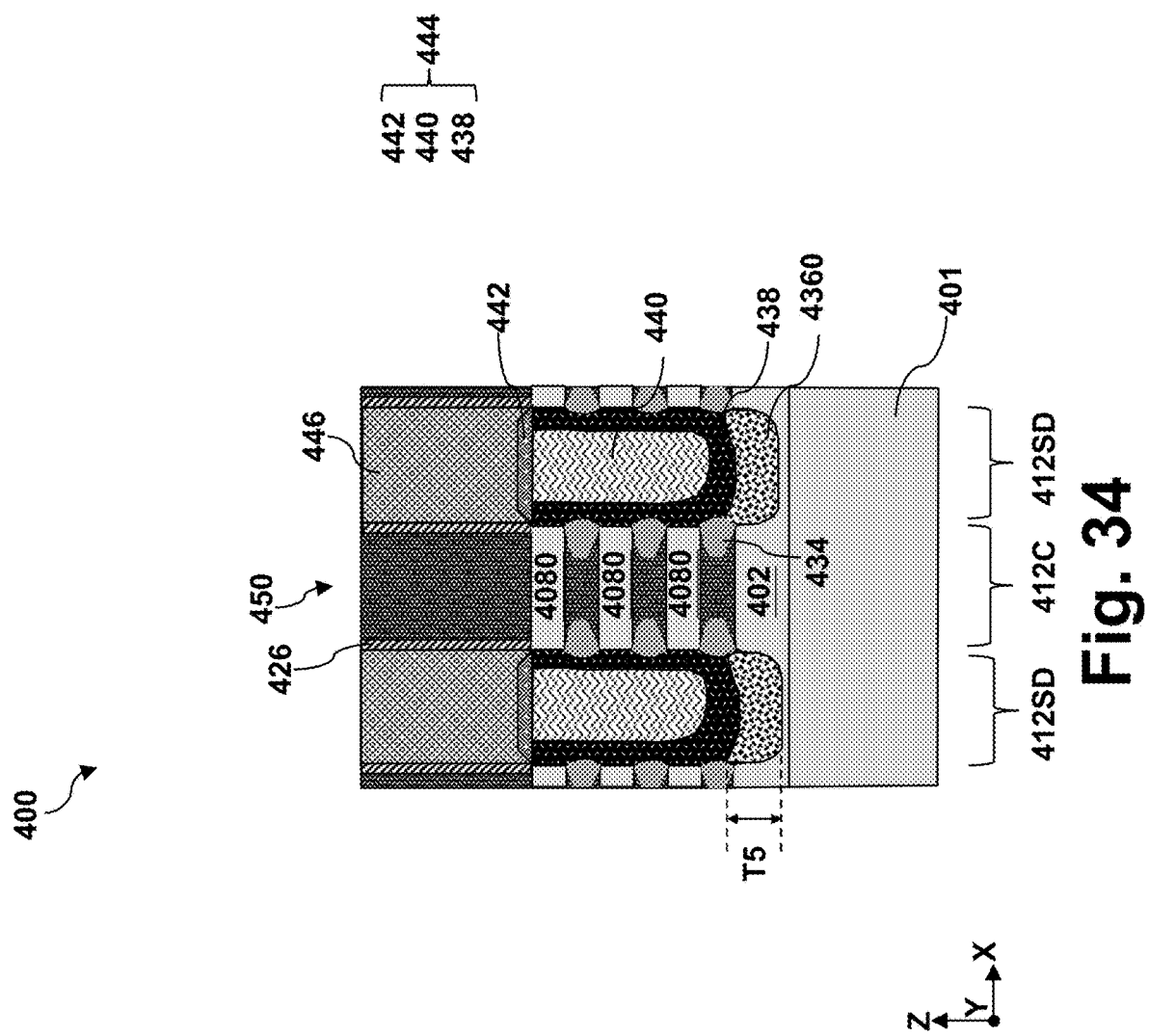
FIGS. 34 and 35 illustrate fragmentary cross-sectional views of semiconductor structures according to various alternative embodiments of the present disclosure.
Figure 35:
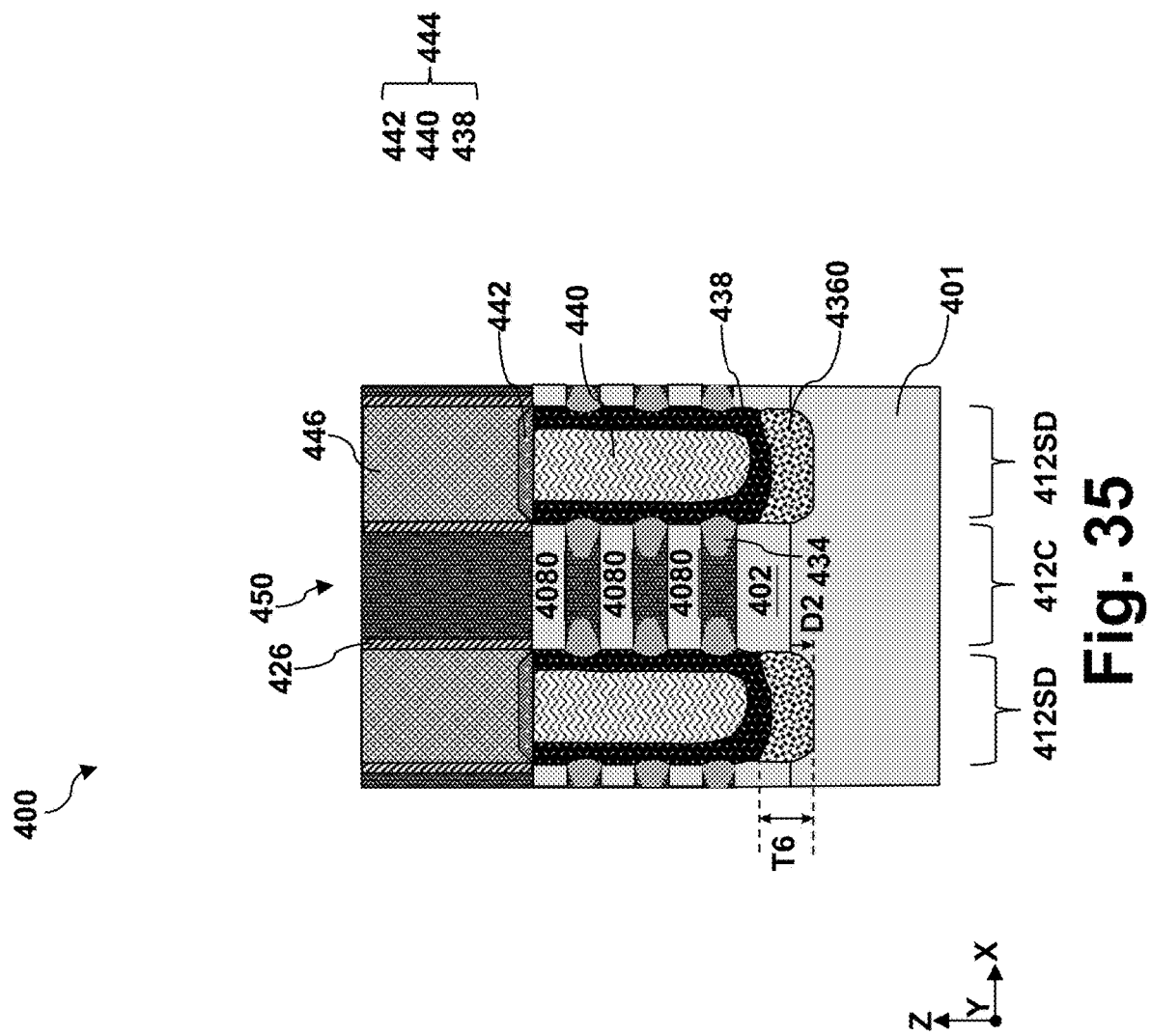

While the method 300 is described in conjunction with cross-sectional views of the workpiece 400 shown in FIGS. 21-33, structures different from those shown in FIG. 33 may be formed using method 300 as well. Example structures according to some alternative embodiments are illustrated in FIGS. 34 and 35. When a low level of leakage or very low off-state current is desired, the diffusion stop layer 4360 may have a bowl-like cross-sectional profile shown in FIG. 34. To form the bowl-like diffusion stop layer 4360 shown in FIG. 34, the etch back at block 314 is performed for a shorter period of time or a lesser extent such that more semiconductor layer 436 is left on the bottom surface of the source/drain trench 428. Because a bottom surface of the source/drain trench 428 may be curved, a thicker diffusion stop layer 4360 may have edges that curve more upward, which reduces leakage into the substrate 401 at an angle. As shown in FIG. 34, in these example alternative embodiments, the vertically thicker diffusion stop layer reduces leakage along the vertical direction and the curved-up edge provide additional lateral diffusion stoppage. As compared to the diffusion stop layer 4360 in FIG. 33, the thicker bowl-like diffusion stop layer 4360 has a fifth thickness T5 greater than the fourth thickness T4. In some instances, the fifth thickness T5 may be between about 2 nm and 25 nm.

FIG. 35 illustrates alternative embodiments where the source/drain trench 428 is allowed to extend into the substrate 401 and expose a portion of the substrate 401 and a portion of the diffusion stop layer 4360 extends into the substrate 401. As described above with respect to the operations at block 310, in some embodiments, the source/drain trench 428 does not extend through the epitaxial layer 402 because doing so may lower the quality of the source/drain feature 444 and may increase the leakage through the substrate 401. In the alternative embodiments shown in FIG. 35, the source/drain trench 428 is intentionally formed deeper to extend partially into the substrate 401. Such a deep source/drain trench 428 allows sufficient volume of the more conductive second epitaxial layer 440 without sacrificing the thickness of the diffusion stop layer 4360. In some instances, such a deep source/drain trench 428 enables thicker diffusion stop layer 4360 for lower leakage current. In some embodiments represented in FIG. 35, the thicker diffusion stop layer 4360 has a sixth thickness T6, which is greater than the fifth thickness T5 or the fourth thickness T4. In some instances, the sixth thickness T6 is between about 15 nm and about 30 nm. When the sixth thickness T6 is smaller than 15 nm, the lattice strain at the interface of the diffusion stop layer 4360 and the substrate 401 is unable to dissipate and quality of the source/drain feature 444 may suffer. When the sixth thickness T6 is greater than 30 nm, it is difficult to form the deep source/drain trench 428 that has such a high aspect ratio and the source/drain feature 444 may partially extend below a top surface of the substrate 401, which may increase the leakage risk. As shown in FIG. 35, in these alternative embodiments, a portion of the diffusion stop layer 4360 may extend below the top surface of the substrate 401 by a second depth D2. In some instances, the second depth D2 is between about 5 nm and about 20 nm.

In one exemplary aspect, the present disclosure is directed to a method. The method includes depositing a top epitaxial layer over a substrate, forming a fin structure from the top epitaxial layer and a portion of the substrate, recessing a source/drain region of the fin structure to form a source/drain recess that extends into and terminates in the top epitaxial layer, conformally depositing a semiconductor layer over surfaces of the source/drain recess, etching back the semiconductor layer to form a diffusion stop layer over a bottom surface of the source/drain recess, depositing a first epitaxial layer over the diffusion stop layer and sidewalls of source/drain recess, depositing a second epitaxial layer over the first epitaxial layer, and depositing a third epitaxial layer over the second epitaxial layer. The top epitaxial layer includes a first germanium concentration, the diffusion stop layer includes a second germanium concentration and the first epitaxial layer includes a third germanium concentration. The second germanium concentration is greater than the first germanium concentration or the third germanium concentration.

In some embodiments, the depositing of the second epitaxial layer includes depositing the second epitaxial layer directly on sidewalls of the source/drain recess and the diffusion stop layer. In some implementations, the second germanium concentration is between about 25% and about 35%. In some instances, a difference between the second germanium concentration and the third germanium concentration is greater than 5%. In some embodiments, the depositing of the first epitaxial layer includes in-situ doping the first epitaxial layer with a p-type dopant, the depositing of the second epitaxial layer includes in-situ doping the second epitaxial layer with the p-type dopant, and the depositing of the third epitaxial layer includes in-situ doping the third epitaxial layer with the p-type dopant. In some instances, the p-type dopant includes boron (B). In some embodiments, the depositing of the semiconductor layer includes in-situ doping the semiconductor layer with phosphorus (P) or carbon (C). In some implementations, a doping concentration of phosphorus (P) or carbon (C) in the semiconductor layer is between $5\times10^{18}$ atoms/cm$^3$ and about $5\times10^{20}$ atoms/cm$^3$.

In another exemplary aspect, the present disclosure is directed to a method. The method includes receiving a workpiece comprising a top epitaxial layer disposed on a substrate, forming a fin structure from the top epitaxial layer and a portion of the substrate, recessing a source/drain region of the fin structure to form a source/drain recess, depositing a semiconductor layer over sidewalls and a bottom surface of the source/drain recess, etching back the semiconductor layer to form a diffusion stop layer over a bottom surface of the source/drain recess, depositing a first epitaxial layer over the diffusion stop layer and sidewalls source/drain recess, and depositing a second epitaxial layer over the first epitaxial layer. The etching back comprises etching a [110] crystalline direction of the semiconductor layer at a first rate and etching a [100] crystalline direction of the semiconductor layer at a second rate smaller than the first rate.

In some embodiments, the etching back includes use of hydrogen and hydrogen chloride. In some implementations, the etching back includes etching the semiconductor layer on the sidewalls of the source/drain recess faster than the semiconductor layer on the bottom surface of the source/drain recess. In some instances, the etching back includes a process temperature between about 500° C. and about 800° C. and the etching back includes a process pressure between about 5 torr and about 350 torr. In some implementations, the source/drain recess extends into the top epitaxial layer but does not extend into the substrate. In some instances, the depositing of the first epitaxial layer includes in-situ doping the first epitaxial layer with a p-type dopant. The depositing of the second epitaxial layer includes in-situ doping the second epitaxial layer with the p-type dopant and the depositing of the semiconductor layer includes in-situ doping the semiconductor layer with phosphorus (P) or carbon (C). In some embodiments, the p-type dopant comprises boron (B) and a doping concentration of phosphorus (P) or carbon (C) in the semiconductor layer is smaller than $5\times10^{20}$ atoms/cm$^3$.

In yet another exemplary aspect, the present disclosure is directed to a semiconductor structure. The semiconductor structure includes a fin structure having a bottom portion and a top portion disposed on the bottom portion. The fin structure includes a source/drain region and a channel region adjacent the source/drain region. The semiconductor structure further includes a source/drain feature disposed over and extending into the source/drain region and a diffusion stop layer sandwiched vertically between the first epitaxial layer and the source/drain region. The source/drain feature includes a first epitaxial layer and a second epitaxial layer disposed over the first epitaxial layer. The diffusion stop layer does not extend into the bottom portion of the fin structure. The top portion includes a first germanium concentration, the diffusion stop layer includes a second germanium concentration and the first epitaxial layer includes a third germanium concentration. The second germanium concentration is different from the first germanium concentration or the third germanium concentration. In some embodiments, the bottom portion includes silicon and the top portion includes silicon germanium. In some implementations, the second germanium concentration is between about 25% and about 35%. In some instances, a difference between the second germanium concentration and the third germanium concentration is greater than 5%.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    depositing a top epitaxial layer directly on a top surface a substrate using molecular beam epitaxy (MBE) or vapor phase deposition (VPE);
    forming a first fin structure and a second fin structure from the top epitaxial layer and a portion of the substrate such that each of the first fin structure and the second fin structure comprises a lower portion made out of the substrate and an upper portion made of the top epitaxial layer;
    depositing a dielectric material over the substrate, the first fin structure and the second fin structure;

etching back the dielectric material to form an isolation feature having a first portion disposed between the first fin structure and the second fin structure and a second portion not disposed between the first fin structure and the second fin structure, a top surface of the first portion being higher than a top surface of the second portion;

recessing source/drain regions of the first fin structure and the second fin structure to form a source/drain recess that extends into and terminates in the top epitaxial layer;

conformally depositing a semiconductor layer over surfaces of the source/drain recess;

etching back the semiconductor layer to form a diffusion stop layer over a bottom surface of the source/drain recess, depositing a first epitaxial layer over the diffusion stop layer and sidewalls source/drain recess;

depositing a second epitaxial layer over the first epitaxial layer; and depositing a third epitaxial layer over the second epitaxial layer, wherein the top epitaxial layer comprises a first germanium concentration, the diffusion stop layer comprises a second germanium concentration and the first epitaxial layer comprises a third germanium concentration, wherein the second germanium concentration is greater than the first germanium concentration or the third germanium concentration.

2. The method of claim 1, wherein the depositing of the second epitaxial layer comprises depositing the second epitaxial layer directly on sidewalls of the source/drain recess and the diffusion stop layer.

3. The method of claim 1, wherein the second germanium concentration is between about 25% and about 35%.

4. The method of claim 3, wherein a difference between the second germanium concentration and the third germanium concentration is greater than 5%.

5. The method of claim 1,
wherein the depositing of the first epitaxial layer comprises in-situ doping the first epitaxial layer with a p-type dopant,
wherein the depositing of the second epitaxial layer comprises in-situ doping the second epitaxial layer with the p-type dopant,
wherein the depositing of the third epitaxial layer comprises in-situ doping the third epitaxial layer with the p-type dopant.

6. The method of claim 5, wherein the p-type dopant comprises boron (B).

7. The method of claim 5, wherein the depositing of the semiconductor layer comprises in-situ doping the semiconductor layer with phosphorus (P) or carbon (C).

8. The method of claim 7, wherein a doping concentration of phosphorus (P) or carbon (C) in the semiconductor layer is between $5 \times 10^{18}$ atoms/cm$^3$ and about $5 \times 10^{20}$ atoms/cm$^3$.

9. A method, comprising:
receiving a workpiece comprising a top epitaxial layer disposed directly on a top surface of a substrate;
forming a first fin structure and a second fin structure from the top epitaxial layer and a portion of the substrate such that each of the first fin structure and the second fin structure comprises a lower portion made out of the substrate and an upper portion made out of the top epitaxial layer;
depositing a dielectric material over the substrate, the first fin structure and the second fin structure;
etching back the dielectric material to form an isolation feature having a first portion disposed between the first fin structure and the second fin structure and a second portion not disposed between the first fin structure and the second fin structure, a top surface of the first portion being higher than a top surface of the second portion;
recessing source/drain regions of the first fin structure and the second fin structure to form a source/drain recess;
depositing a semiconductor layer over sidewalls and a bottom surface of the source/drain recess;
etching back the semiconductor layer to form a diffusion stop layer over a bottom surface of the source/drain recess,
depositing a first epitaxial layer over the diffusion stop layer and sidewalls source/drain recess; and
depositing a second epitaxial layer over the first epitaxial layer such that the second epitaxial layer spans continuously over the first portion of the isolation feature,
wherein the etching back comprises etching a [110] crystalline direction of the semiconductor layer at a first rate and etches a [100] crystalline direction of the semiconductor layer at a second rate smaller than the first rate.

10. The method of claim 9, wherein the etching back comprises use of hydrogen and hydrogen chloride.

11. The method of claim 9, wherein the etching back comprises etching the semiconductor layer on the sidewalls of the source/drain recess faster than the semiconductor layer on the bottom surface of the source/drain recess.

12. The method of claim 9,
wherein the etching back comprises a process temperature between about 500° C. and about 800° C.,
wherein the etching back comprises a process pressure between about 5 torr and about 350 torr.

13. The method of claim 9, wherein the source/drain recess extends into the top epitaxial layer but does not extend into the substrate.

14. The method of claim 9,
wherein the depositing of the first epitaxial layer comprises in-situ doping the first epitaxial layer with a p-type dopant,
wherein the depositing of the second epitaxial layer comprises in-situ doping the second epitaxial layer with the p-type dopant,
wherein the depositing of the semiconductor layer comprises in-situ doping the semiconductor layer with phosphorus (P) or carbon (C).

15. The method of claim 14, wherein the p-type dopant comprises boron (B).

16. The method of claim 14, wherein a doping concentration of phosphorus (P) or carbon (C) in the semiconductor layer is smaller than $5 \times 10^{20}$ atoms/cm$^3$.

17. A method, comprising:
depositing a top epitaxial layer directly on a top surface of a substrate;
depositing a stack directly on a top surface of the top epitaxial layer, the stack comprising a plurality of channel layers interleaved by a plurality of sacrificial layers;
forming a first fin-shaped structure and a second fin-shaped structure from the stack, the top epitaxial layer, and a portion of the substrate;
depositing a dielectric material over the substrate, the first fin-shaped structure and the second fin-shaped structure;
etching back the dielectric material to form an isolation feature having a first portion disposed between the first fin-shaped structure and the second fin-shaped structure and a second portion not disposed between the first fin-shaped structure and the second fin-shaped structure, a top surface of the first portion being higher than a top surface of the second portion;

recessing source/drain regions of the first fin-shaped structure and the second fin-shaped structure to form a source/drain recess that extends into and terminates in the top epitaxial layer;

conformally depositing a semiconductor layer over the source/drain recess;

etching back the semiconductor layer to expose sidewalls of the source/drain recess and form a diffusion stop layer over a bottom surface of the source/drain recess, depositing a first epitaxial layer over the diffusion stop layer and sidewalls source/drain recess;

depositing a second epitaxial layer over the first epitaxial layer; and depositing a third epitaxial layer over the second epitaxial layer, wherein the substrate comprises silicon, wherein the top epitaxial layer comprises silicon germanium, wherein a top surface of the diffusion stop layer is lower than the top surface of the first portion of the isolation feature.

18. The method of claim 17, wherein a germanium content of the top epitaxial layer is between about 18% and about 25%.

19. The method of claim 17, wherein the top epitaxial layer comprises a first germanium concentration, the diffusion stop layer comprises a second germanium concentration and the first epitaxial layer comprises a third germanium concentration, wherein the second germanium concentration is greater than the first germanium concentration or the third germanium concentration.

20. The method of claim 17, further comprising:

before the depositing of the conformally depositing of the semiconductor layer, partially and selectively etching the plurality of sacrificial layers to form inner spacer recesses; and forming inner spacer features into the inner spacer recesses.

* * * * *